(12) United States Patent
Millward

(10) Patent No.: US 8,394,483 B2
(45) Date of Patent: Mar. 12, 2013

(54) TWO-DIMENSIONAL ARRAYS OF HOLES WITH SUB-LITHOGRAPHIC DIAMETERS FORMED BY BLOCK COPOLYMER SELF-ASSEMBLY

(75) Inventor: Dan B. Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 871 days.

(21) Appl. No.: 11/657,273

(22) Filed: Jan. 24, 2007

(65) Prior Publication Data

US 2008/0176767 A1 Jul. 24, 2008

(51) Int. Cl.
*B32B 5/12* (2006.01)
(52) U.S. Cl. ........ 428/105; 428/113; 977/778; 977/784; 977/789; 977/790
(58) Field of Classification Search .................. 428/105, 428/113; 977/778, 784, 789, 790
See application file for complete search history.

(56) References Cited

U.S. PATENT DOCUMENTS

| | | | |
|---|---|---|---|
| 4,623,674 A | 11/1986 | Bailey, Jr. | |
| 4,877,647 A | 10/1989 | Klabune | |
| 5,328,810 A | 7/1994 | Lowrey et al. | |
| 5,374,367 A | 12/1994 | Edamura et al. | |
| 5,382,373 A | 1/1995 | Carlson | |
| 5,482,656 A | 1/1996 | Hiraoka et al. | |
| 5,512,131 A | 4/1996 | Kumar et al. | |
| 5,538,655 A | 7/1996 | Fauteux et al. | |
| 5,622,668 A | 4/1997 | Thomas | |
| 5,834,583 A | 11/1998 | Hancock et al. | |
| 5,849,810 A | 12/1998 | Muller | |
| 5,879,582 A | 3/1999 | Havelka et al. | |
| 5,891,356 A | 4/1999 | Inoue et al. | |
| 5,904,824 A | 5/1999 | Oh | |
| 5,925,259 A | 7/1999 | Biebuyck et al. | |
| 5,948,470 A | 9/1999 | Harrison et al. | |
| 6,111,323 A | 8/2000 | Carter et al. | |
| 6,143,647 A | 11/2000 | Pan et al. | |
| 6,270,946 B1 | 8/2001 | Miller | |
| 6,310,138 B1 | 10/2001 | Yonezawa et al. | |
| 6,312,971 B1 | 11/2001 | Amundson et al. | |
| 6,368,871 B1 | 4/2002 | Christel et al. | |
| 6,403,382 B1 | 6/2002 | Zhu et al. | |
| 6,423,465 B1 | 7/2002 | Hawker et al. | |
| 6,503,841 B1 | 1/2003 | Criscuolo | |
| 6,506,660 B2 | 1/2003 | Holmes et al. | |
| 6,548,830 B1 | 4/2003 | Noguchi et al. | |
| 6,565,763 B1 | 5/2003 | Asakawa | |
| 6,566,248 B1 | 5/2003 | Wang et al. | |

(Continued)

FOREIGN PATENT DOCUMENTS

| | | |
|---|---|---|
| CN | 1562730 | 1/2005 |
| EP | 0784543 | 4/2000 |

(Continued)

OTHER PUBLICATIONS

Bearinger, J.P., et al., Nature Materials 2, 259-264, 2003.

(Continued)

*Primary Examiner* — Edward Cain
(74) *Attorney, Agent, or Firm* — TraskBritt

(57) ABSTRACT

Methods for fabricating sublithographic, nanoscale microstructures in two-dimensional square and rectangular arrays utilizing self-assembling block copolymers, and films and devices formed from these methods are provided.

28 Claims, 17 Drawing Sheets

U.S. PATENT DOCUMENTS

| | | |
|---|---|---|
| 6,569,528 B2 | 5/2003 | Nam et al. |
| 6,573,030 B1 | 6/2003 | Fairbairn et al. |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,884,842 B2 | 4/2005 | Soane et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,913,697 B2 * | 7/2005 | Lopez et al. .................. 210/644 |
| 6,924,341 B2 | 8/2005 | Mays |
| 6,926,953 B2 | 8/2005 | Nealey et al. |
| 6,946,332 B2 | 9/2005 | Loo et al. |
| 6,949,456 B2 | 9/2005 | Kumar |
| 6,957,608 B1 | 10/2005 | Hubert et al. |
| 6,962,823 B2 * | 11/2005 | Empedocles et al. ............. 438/3 |
| 6,989,426 B2 | 1/2006 | Hu et al. |
| 6,992,115 B2 | 1/2006 | Hawker et al. |
| 6,998,152 B2 | 2/2006 | Uhlenbrock |
| 7,030,495 B2 | 4/2006 | Colburn et al. |
| 7,030,795 B1 | 4/2006 | Colburn |
| 7,037,744 B2 | 5/2006 | Colburn et al. |
| 7,045,851 B2 | 5/2006 | Black et al. |
| 7,056,455 B2 | 6/2006 | Matyjaszewski et al. |
| 7,056,849 B2 | 6/2006 | Wan et al. |
| 7,077,992 B2 | 7/2006 | Sreenivasan et al. |
| 7,090,784 B2 | 8/2006 | Asakawa et al. |
| 7,115,525 B2 | 10/2006 | Abatchev et al. |
| 7,115,995 B2 | 10/2006 | Wong |
| 7,118,784 B1 | 10/2006 | Xie |
| 7,132,370 B2 | 11/2006 | Paraschiv |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,166,304 B2 | 1/2007 | Harris et al. |
| 7,172,953 B2 | 2/2007 | Lieber |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,252,791 B2 | 8/2007 | Wasserscheid et al. |
| 7,259,101 B2 | 8/2007 | Zurcher et al. |
| 7,282,240 B1 | 10/2007 | Jackman et al. |
| 7,291,284 B2 | 11/2007 | Mirkin et al. |
| 7,326,514 B2 | 2/2008 | Dai et al. |
| 7,332,627 B2 | 2/2008 | Chandross et al. |
| 7,347,953 B2 | 3/2008 | Black et al. |
| 7,407,887 B2 * | 8/2008 | Guo ............................ 438/682 |
| 7,408,186 B2 * | 8/2008 | Merkulov et al. ............... 257/40 |
| 7,514,339 B2 | 4/2009 | Yang et al. |
| 7,521,090 B1 | 4/2009 | Cheng et al. |
| 7,553,760 B2 | 6/2009 | Yang et al. |
| 7,592,247 B2 | 9/2009 | Yang et al. |
| 7,605,081 B2 | 10/2009 | Yang et al. |
| 7,632,544 B2 | 12/2009 | Ho et al. |
| 7,767,099 B2 | 8/2010 | Li et al. |
| 2002/0055239 A1 | 5/2002 | Tuominen et al. |
| 2002/0158342 A1 | 10/2002 | Tuominen et al. |
| 2003/0077452 A1 | 4/2003 | Guire et al. |
| 2003/0091752 A1 | 5/2003 | Nealey et al. |
| 2003/0100822 A1 | 5/2003 | Lew et al. |
| 2003/0143375 A1 | 7/2003 | Noguchi et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0235930 A1 | 12/2003 | Bao et al. |
| 2004/0028875 A1 | 2/2004 | Van Rijn et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0175628 A1 | 9/2004 | Nealey et al. |
| 2004/0192013 A1 | 9/2004 | Ryu et al. |
| 2004/0222415 A1 | 11/2004 | Cho |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1 * | 7/2005 | Tavkhelidze et al. ......... 428/687 |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0038182 A1 | 2/2006 | Rogers et al. |
| 2006/0046079 A1 | 3/2006 | Lee et al. |
| 2006/0046480 A1 * | 3/2006 | Guo ............................ 438/685 |
| 2006/0060863 A1 * | 3/2006 | Lu et al. ......................... 257/77 |
| 2006/0062867 A1 | 3/2006 | Choi |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0231525 A1 | 10/2006 | Asakawa et al. |
| 2006/0249784 A1 | 11/2006 | Black et al. |
| 2006/0249796 A1 * | 11/2006 | Tavkhelidze et al. ......... 257/371 |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealey et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0071881 A1 | 3/2007 | Chua et al. |
| 2007/0072403 A1 | 3/2007 | Sakata |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0227383 A1 | 10/2007 | Decre et al. |
| 2007/0249117 A1 | 10/2007 | Kang et al. |
| 2007/0281220 A1 | 12/2007 | Sandhu et al. |
| 2007/0289943 A1 | 12/2007 | Lu et al. |
| 2007/0293041 A1 | 12/2007 | Yang et al. |
| 2008/0032238 A1 | 2/2008 | Lu et al. |
| 2008/0083991 A1 | 4/2008 | Yang et al. |
| 2008/0093743 A1 | 4/2008 | Yang et al. |
| 2008/0103256 A1 | 5/2008 | Kim et al. |

| | | | |
|---|---|---|---|
| 2008/0164558 A1 | 7/2008 | Yang et al. | |
| 2008/0193658 A1 | 8/2008 | Millward | |
| 2008/0217292 A1 | 9/2008 | Millward et al. | |
| 2008/0233323 A1 | 9/2008 | Cheng et al. | |
| 2008/0257187 A1 | 10/2008 | Millward | |
| 2008/0260941 A1 | 10/2008 | Jin | |
| 2008/0274413 A1 | 11/2008 | Millward | |
| 2008/0286659 A1 | 11/2008 | Millward | |
| 2008/0311347 A1 | 12/2008 | Millward et al. | |
| 2008/0315270 A1 | 12/2008 | Marsh et al. | |
| 2008/0318005 A1 | 12/2008 | Millward | |
| 2009/0062470 A1 | 3/2009 | Millward et al. | |
| 2009/0200646 A1 | 8/2009 | Millward et al. | |
| 2009/0206489 A1 | 8/2009 | Li et al. | |
| 2009/0236309 A1 | 9/2009 | Millward et al. | |
| 2009/0240001 A1 | 9/2009 | Regner | |
| 2009/0263628 A1 | 10/2009 | Millward | |
| 2009/0274887 A1 | 11/2009 | Millward et al. | |
| 2010/0092873 A1 | 4/2010 | Sills et al. | |
| 2010/0102415 A1 | 4/2010 | Millward et al. | |
| 2010/0124826 A1 | 5/2010 | Millward et al. | |
| 2010/0137496 A1 | 6/2010 | Millward et al. | |
| 2010/0163180 A1 | 7/2010 | Millward | |
| 2010/0204402 A1 | 8/2010 | Millward et al. | |
| 2010/0279062 A1 | 11/2010 | Millward | |
| 2010/0316849 A1 | 12/2010 | Millward et al. | |
| 2010/0323096 A1 | 12/2010 | Sills et al. | |

FOREIGN PATENT DOCUMENTS

| | | | |
|---|---|---|---|
| EP | 0784543 B1 | | 4/2000 |
| EP | 1416303 A2 | | 5/2004 |
| EP | 1593164 B1 | | 6/2010 |
| JP | 11080414 | | 3/1999 |
| JP | 11080414 | A | 3/1999 |
| JP | 2005008882 | | 1/2005 |
| JP | 2005008882 | A | 1/2005 |
| JP | 2006036923 | | 2/2006 |
| JP | 2006036923 | A | 2/2006 |
| JP | 2006055982 | | 3/2006 |
| JP | 2006055982 | A | 3/2006 |
| JP | 2008-036491 | A | 2/2008 |
| TW | 200400990 | A | 1/2004 |
| TW | 200419017 | | 10/2004 |
| TW | 200511364 | | 3/2005 |
| TW | I253456 | | 4/2006 |
| TW | 256110 | | 6/2006 |
| WO | 90/07575 | | 7/1990 |
| WO | 9007575 | | 7/1990 |
| WO | 97/06013 | | 2/1997 |
| WO | 9706013 | | 2/1997 |
| WO | 9839645 | | 9/1998 |
| WO | 99/47570 | | 9/1999 |
| WO | 9947570 | | 9/1999 |
| WO | 0031183 A1 | | 6/2000 |
| WO | 02081372 | | 10/2002 |
| WO | 2005/122285 A2 | | 12/2005 |
| WO | 2005122285 | | 12/2005 |
| WO | 2006/076016 | | 7/2006 |
| WO | 2006/078952 | | 7/2006 |
| WO | 2006076016 | | 7/2006 |
| WO | 2006078952 | | 7/2006 |
| WO | 2007/001294 A1 | | 1/2007 |
| WO | 2007/019439 A3 | | 2/2007 |
| WO | 2007013889 | | 2/2007 |
| WO | 2007019439 | | 2/2007 |
| WO | 2007/024241 | | 3/2007 |
| WO | 2007/024323 A2 | | 3/2007 |
| WO | 2007024241 | | 3/2007 |
| WO | 2007024323 | | 3/2007 |
| WO | 2007/055041 | | 5/2007 |
| WO | 2007055041 | | 5/2007 |
| WO | 2008/091741 A2 | | 7/2008 |
| WO | 2008/097736 A2 | | 8/2008 |
| WO | 2008096335 A2 | | 8/2008 |
| WO | 2008/124219 A2 | | 10/2008 |
| WO | 2008118635 | | 10/2008 |
| WO | 2008130847 A1 | | 10/2008 |
| WO | 2008145268 A1 | | 12/2008 |
| WO | 2008156977 A2 | | 12/2008 |
| WO | 2009099924 | | 8/2009 |
| WO | 2009102551 | | 8/2009 |
| WO | 2009117238 | | 9/2009 |
| WO | 2009117243 | | 9/2009 |
| WO | 2009134635 | | 11/2009 |

OTHER PUBLICATIONS

Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Ge, Zhenbin, et al., PRL 96, 186101-1—186101-4, The American Physical Society, week ending May 12, 2006.

Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.

Mindel, Joseph., et.al., "A Study of Bredig Platinum Sols", The Chemical Laboratories of New York University, vol. 65 pp. 2112.

Wang, C., et al., Electrochimica Acta 52 (2006), pp. 704-709.

Gudipati, Chakravarthy S., et al., Journal of Polymer Science Part A: Polymer Chemistry, vol. 42, pp. 6193-6208.

Bulpitt, Paul et al, Journal of Biomedical Materials Research, vol. 47, Issue 2, pp. 152-169, Abstract only.

Ji, Shengxiang, et al., Macromolecules, 2008, 41(23): 9098-9103.

Cheng, Joy Y., et al., Adv. Mater. 2003, 15, No. 19, Oct. 2, pp. 1599-1602.

Cheng, Joy Y., et al., Nano Letters, vol. 6, No. 9, 2006, pp. 2009-2103.

Cheng, Joy Y., et al., Adv. Mater. 2003, vol. 15, No. 19, pp. 1599-1602.

Cheng, Joy Y., et al., Applied Physics Letters, 91, 143106-143106-3 (2007).

Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).

Parejo, Pilar Garcia, et al., J. Mater. Chem., 2006, 16, pp. 2165-2169.

Park, Cheolmin, et al., Polymer 44, 2003, 6725-6760.

Park, Miri, et al., Science, v. 276, No. 5317, p. 1401-1404, May 30, 1997.

Park, Sang-Min, et al., Adv. Mater., 2007, 19, pp. 607-611.

Park, Sung Chan, et al., Macromolecules 2007, vol. 40, No. 22, pp. 8119-8124.

Peters, Richard D., et al., J. Vac. Sci. Technol. B, vol. 18, No. 6, Nov./Dec. 2000, pp. 3530-3532.

Peters, Richard D., et al., Macromolecules, vol. 35, No. 5, 2002, pp. 1822-1834.

Potemkin, Igor I., et al., Macromol. Rapid Commun., 2007, 28, pp. 579-584.

Resnick, Douglas, J., et al., J. Microlith., Microfab., Microsyst., vol. 3, No. 2, Apr. 2004, pp. 316-321.

Ruiz, Ricardo, et al., Adv. Mater, 2007, 19, pp. 587-591.

Ryu, Du Yeol, et al., Macromolecules, vol. 40, No. 12, 2007, pp. 4296-4300.

Saraf, Ravi R., et al., Applied Physics Letters, vol. 80, No. 23, Jun. 10, 2002, pp. 4425-4427.

Shahrjerdi, Davood, et al., IEEE Electron Device Letters, vol. 28, No. 9, Sep. 2007, pp. 793-796.

Sharma, Sadhana, et al., Applied Surface Science, 206 (2003), pp. 218-229.

Sivaniah, E., et al., Macromolecules 2003, 36, pp. 5894-5896.

Sivaniah, et al., Macromolecules 2005, 38, 1837-1849.

Solak, Harun H., Journal of Physics D: Applied Physics, 2006, pp. R171-188.

Stoykovich, Mark P., et al., Science, vol. 308, Jun. 3, 2005, pp. 1442-1446.

Stoykovich, Mark P., et al., ACS Nano, vol. 1, No. 3, 2007, pp. 168-175.

Sundrani, Deepak, et al., Nano Lett., vol. 4, No. 2, 2004, pp. 273-276.

Sundrani, Deepak, et al., Langmuir 2004, vol. 20, No. 12, 2004, pp. 5091-5099.

Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.

Van Poll, Maaike L., et al., Angew. Chem. Int. Ed. 2007, 46, pp. 6634-6637.

Winesett, D.A., et al., Langmuir 2003, 19, pp. 8526-8535.

Xu, Ting et al., Polymer 42, (2001) 9091-9095.

Wu, C.Y., et al., IEEE, 2007, pp. 153-154.

Yamaguchi, Toru, et al., Journal of Photopolymer Science and Technology, vol. 19, No. 3, 2006, pp. 385-388.

Yan, Xiaohu, et al., J. Am. Chem. Soc., vol. 126, No. 32, 2004, pp. 10059-10066.

Yang, Xiao M., et al., Macromolecules 2000, vol. 33, No. 26, 2000, pp. 9575-9582.

Yurt, Serkan, et al., Macromolecules 2006, vol. 39, No. 5, 2006.

Zhang, Mingfu, et al., Adv. Mater. 2007, 19, pp. 1571-1576.

Black, Charles T., "Nonometer-Scale Pattern Registration and Alignment by Directed Diblock Copolymer Self-Assembly," IEEE Transactions on Nanotechnology, vol. 3, No. 3, Sep. 2004, pp. 412-414.

Cheng, Joy Y. et al., "Self-Assembled One-Dimensional Nanostructure Arrays," Nano Letters, vol. 0, No. 0, A-E, Jul. 7, 2006.

Laracuente, A.R. et al., "Step Structure and Surface Morphology of Hydrogen-Terminated Silicon: (001) to (114)," Surface Science 545 (2003) 70-84.

Mansky P. et al., "Controlling Polymer-Surface Interactions with Random Copolymer Brushes," Science, vol. 275, Mar. 7, 1997, pp. 1458-1460.

Meyer, Evelyn et al., "Controlled Dewetting Process on Microstructured Surfaces—A New Procedure for Thin Film Microstructuring," Macromol. Mater. Eng. 276/277, 44-50 (2000).

Niu, Sanjun et al., "Stability of Order in Solvent-Annealed Block Copolymer Thin Films", Macromolecules, vol. 36, No. 7, 2003.

Parejo, Pilar Garcia et al., "Highly Efficient UV-Absorbing Thin-Film Coatings for Protection of Organic Materials Against Photodegradation," Journal of Materials Chemistry, vol. 16, 2006, pp. 2165-2169.

Park, Sang-Min et al., "Directed Assembly of Lamellae-Forming Block Copolymers by Using Chemically and Topographically Patterned Substrates," Advanced Materials, vol. 19, 2007, pp. 607-611.

Ruiz, Ricardo et al., "Induced Orientational Order in Symmetric Diblock Copolymer Thin Films," Advanced Materials, vol. 19, 2007, pp. 587-591.

Sundrani, Deepak et al., "Guiding Polymers to Perfection: Macroscopic Alignment of Nanoscale Domains," Nano Letters, vol. 4, No. 2, 2004, pp. 273-276.

Sundrani, Deepak et al., "Hierarchical Assembly and Compliance of Aligned Nanoscale Polymer Cylinders in Confinement," Langmuir, vol. 20, 2004, pp. 5091-5099.

Winesett, D.A. et al., "Tuning Substrate Surface Energies for Blends of Polystyrene and Poly(methyl methacrylate)," Langmuir, vol. 19, 2003, 8526-8535.

Yamaguchi, Toru et al., "Resist-Pattern Guided Self-Assembly of Symmetric Diblock Copolymer," Journal of Photopolymer Science and Technology, vol. 19, No. 3, 2006, 385-388.

Yang, Xiao M. et al., "Guided Self-Assembly of Symmetric Diblock Copolymer Films on Chemically Nanopatterned Substrates," Macromolecules, vol. 33, 2000, pp. 9575-9582.

Black, C.T., Proc. of SPIE, vol. 6153, 615302 (2006).

Darling, S.B., Progress in Polymer Science, vol. 32, No. 10, Sep. 28, 2007, pp. 1152-1204.

Harrison, Christopher et al., Polymer, vol. 39, No. 13, pp. 2733-2744, 1998.

Kim, Su-Jin, et al., J. Vac. Sci. Technol. B26(1), Jan./Feb. 2008, 189-194.

La, Young-Hye, et al., J. Vac. Sci. Technol. B 25(6), Nov./Dec. 2007, pp. 2508-2513.

Olayo-Valles, Roberto et al., J. Mater. Chem, 2004, 14, 2729-2731.

Yang, XiaoMin, et al., J. Vac. Sci. Technol. B 22(6), Nov./Dec. 2004, 3331-3334.

Arshady et al., Makromol. Chem., 1976, vol. 177, p. 2911-2918.

Bang, J. Abstract submitted for the Mar. '06 meeting of the American Physical Society, submitted Nov. 2005 [online], accessed via the Internet [retrieved on Apr. 5, 2010], URL: <http://absimage.aps.org/image/MWS_MAR06-2005-003641.pdf>.

Candau et al., Polymer, 1977, vol. 18, p. 1253-1257.

Hawker et al., Facile Synthesis of Block Copolymers for Nanolithographic Applications; Polymer Reprints, 2005.

Nishikubo, T., American Chemical Society Symposium Series, 1997, p. 214-230.

He, Yiyong et al., J. Am Chem. Soc., 2006, 128, pp. 2745-2750.

Ali, H.A., et al., Solid-State Electronics, 46 (2002) 1639-1642.

Berry et al., Orientational Order in Block Copolymer Films Zone Annealed below the Order-Disorder Transition Temperature, Nano Letters vol. 7, No. 9 Aug. 2007, p. 2789-2794.

Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.

Hammond et al., Temperature Dependence of Order, Disorder, and Defects in Laterally Confined Diblock Copolymer Cylinder Monolayers, Macromoleculars vol. 38, Jul. 2005; p. 6575-6585.

Knoll et al., Phase Behavior in Thin Films of Cylinder-Forming Block Copolymers, Physical Review Letters vol. 89, No. 3 Jul. 2002.

Zehner, Robert W. et al., Langmuir, vol. 14, No. 2, pp. 241-244, Jan. 20, 1998.

Naito, Katsuyuki et al., IEEE Transactions on Magnetics, vol. 38, No. 5, Sep. 2002, pp. 1949-1951.

Cheng, Joy Y., et al., Nano Letters, vol. 6, No. 9, published on Web Aug. 16, 2006; pp. 2099-2103.

Cheng, Joy Y., et al., Adv Mater. 2003, 15, No. 19, Oct. 2, pp. 1599-1602.

Park, Cheolmin, Polymer 44 (2003), 6725-6760.

Wipf, Handbook of Reagents for Organic Synthesis, 2005, John Wiley & Sons Ltd., p. 320.

Ikeda, Susumu et al., NanotechJapan Bulletin—vol. 3, No. 3, Dec. 17, 2010/Focus 26-06.

Cha, Jennifer N., et al., Chem. Mater. 2007, 19, 839-843.

Chang, Li-Wen, Proc. Of SPIE, vol. 6156, 2006, 615611-1 to 615611-6.

Chang, Li-Wen, IEEE International Electron Devices Meeting (IEDM), paper 33.2, Dec. 6-8, San Francisco, 2010, pp. 33.2.1-33.2.4.

Ji, Shengxiang et al., ACS Nano, vol. 4, No. 2, 2010, pp. 599-609.

Metters, Andrew, et al., Biomacromolecules 2005, 6 pp. 290-301, 2005.

Park, Seung Hak, et al., Soft Matter, 2010, 6, 2010, 120-125.

Yamaguchi, Toru, et al., Microprocesses and Nanotechnology, 2007, Conference date Nov. 5-8, 2007, pp. 434-435.

Zhang, Yuan et al., Applied Physics Letter, 91, 013104, 2007, pp. 013104 to 013104-3.

Bearinger et al., Chemisorbed Poly(Propylene Sulphide) Based Copolymers Resist Biomolecular Interactions, Nature Materials, vol. 2, pp. 259-264, 2003.

Berry et al., Orientational Order in Block Copolymer Films Zone Annealed below the Order-Disorder Transition Temperature, Nano Letters vol. 7, No. 9 Aug. 2007, p. 2789-2794.

Black., Self-Aligned Self Assembly of Multi-Nanowire Silicon Field Effect Transistors, Applied Physics Letters 87, 163116-1 to 1163116-3, 2005.

Black et al., Polymer Self Assembly in Semiconductor Microelectronics, IBM J. Res. & Dev., vol. 51, No. 5, Sep. 2007, pp. 605-633.

Black et al., Integration of Self Assembly for Semiconductor Microelectronics, IEEE 2005 Custom Integrated Circuits Conference, pp. 87-91 (2005).

Black, Nanometer-Scale Pattern Registration and Alignment by Directed Diblock Copolymer Self-Assembly, IEEE Transactions on Nanotechnology, vol. 3, No. 3, Sep. 2004, pp. 412-415.

Chandekar et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).

Choi et al., Magnetorheology of Synthesized Core-Shell Structured Nanopractice, IEEE Transactions on Magnetics 41(10):3448-3450 (2005).

Hawker et al., "Improving the manufacturability and structural control of block copolymer lithography," Abstracts of Papers, 232nd ACS National Meeting, San Francisco, CA, Sep. 10-14, 2006.

Helmbold et al., Optical Absorption of Amorphous Hydrogenated Carbon Thin Films, Thin Solid Films, vol. 283, pp. 196-203 (1996).

Ji et al., Molecular Transfer Printing Using Block Copolymers, ACS Nano, vol. 4, No. 2, 2010, pp. 599-609.

Nguyen et al., Photopolymerizable Hydrogels, for Tissue Engineering Applications, Biomaterials 23, 2002, pp. 4307-4314.

Ruiz et al., Density Multiplication and Improved Lithography by Directed Block Copolymer Assembly, Science, vol. 321, Aug. 15, 2008, pp. 936-939.

Search Report of the IPO, Taiwanese Application No. 097110156, issued Apr. 10, 2012, two pages.

Truskett et al., Trends in Imprint Lithography for Biological Applications, TRENDS in Biotechnology, vol. 24, No. 7, Jul. 2006, pp. 312-315.

Zhu et al., Molecular Assemblies on Silicon Surfaces Via Si-O Linkages, Langmuir, 2006, 1b, 6766-6772.

Berry, B.C., et al., "Effects of Zone Annealing on Thin Films of Block Copolymers", National Institute of Standard and Technology, Polymers Division, Gaithersburg, MD., 2007.

Black, C.T., Applied Physics Letters 87, 163116-1 to 1163116-3, 2005.

Black, Charles T., IEEE Transactions on Nanotechnology, vol. 3, No. 3, Sep. 2004, pp. 412-415.

Cavicchi, Kevin A., et al., Macromolecules 2007, vol. 40, 2007, pp. 1181-1186.

Gudipati, Chakravarthy S., et al., Journal of Polymer Science Part A: Polymer Chemistry, vol.42, pp. 6193-6208, (2004).

Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, pp. 3932-3944, 2005 Wiley Periodicals, Inc.

Karim, Alamgir et al., "Control of Ordering Kinetics and Morphology Using Zone Annealing of Thin Block Copolymer Filmes", Abstract submitted for the Mar. 2007 Meeting of The American Physical Society, Nov. 20, 2006.

Kim, Seung Hyun, et al., Adv. Mater. 2004, 16, No. 3, Feb. 3, pp. 226-231.

Park, Dae-Ho, Nanotechnology 18, 2007, 355304, pp. 1-7.

Peng, Juan et al., Macromol. Rapid Commun. 2007, 28, 1422-1428.

Rogers, John A., ACS Nano, vol. 1, No. 3, pp. 151-153, 2007.

Rozkiewicz, Dorota I., et al., Angew. Chem. Int. Ed., 2006, 45, pp. 5292-5296.

Ruiz, Ricardo et al., Science, vol. 321, Aug. 15, 2008, pp. 936-939.

Segalman, Rachel A., Materials Science and Engineering R 48 (2005), pp. 191-226.

Srinvivasan, Charan, et al., ACS Nano, vol. 1, No. 3, pp. 191-201, 2007.

Xiao, Shuaigang et al., Nanotechnology 16 (2005) S324-S329.

Jun, et al., Langmuir, 2002, 18(9), pp. 3415-3417, Abstract only.

Balsara et al, CPIMA, IRG Technical Programs, Synthesis and application of Nanostructured Materials, Leland Stanford Junior Univ., 2006, http://www.stanford.edu/group/cpima/irg/irg__1.htm, printed Jul. 1, 2009.

Bulpitt, Paul et al, Journal of Biomedical Materials Research, vol. 47, Issue 2, pp. 152-169, Abstract only, (1999).

Elisseeff J., et al., Journal of Biomedical Materials Research, 51(2): 164-171, Aug. 2000, Abstract only.

Gelest Inc., Silane Coupling Agents: Connecting Across Boundaries, pp. 1-56, 2006.

Ji, Shengxiang, et al., Preparation of Neutral Wetting Brushes for Block Copolymer Films from Homopolymer Blends, submitted to Advanced Materials, 20(16): 3054-3060; published online Jul. 7, 2008.

Ji, Shengxiang, et a., Macromolecules, 2008, 41(23): 9098-9103.

Kim, SH, J Biomater Appl., Jul. 2000; 15(1): 23-46 Abstract only.

Kim, SH, J Biomater Res., Mar. 15, 2000; 49(4): 517-27 Abstract only.

Kim, IS, et al., Int J Pharm., Sep. 15, 2000; 205(1-2): 109-16, Abstract only.

Li, Wai-kin, et al, J. Vac. Sci. Technol. B 25(6), Nov./Dec. 2007, pp. 1982-1984.

Lutolf, M.P., et al, Nature Biotechnology, 23, 47-55 (2005), Abstract only.

Martens, P., et al., Polymer, vol. 41, Issue 21, Oct. 2000, pp. 7715-7722, Abstract only.

Matsuda, T., et al., Asaio J, Jul.-Sep. 1992; 38(3): M154-7, Abstract only.

Sawhney, Amarpreet S., et al., Macromolecules 1993, 26, 581-587, Abstract only.

Wathier, Michel, et al., J. Am. Chem. Soc., 2004, 126 (40), pp. 12744-12745, Abstract only.

Bae, Joonwon, "Surface Modification Using Photo-Crosslinkable Random Copolymers", Abstract submitted for the Mar. 2006 meeting of The American Physical Society, submitted Nov. 30, 2005.

Bang, Joona, "The Effect of Humidity on the Ordering of Tri-block Copolymer Thin Films," Abstract submitted for the Mar. 2007 meeting of The American Physical Society, submitted Nov. 20, 2006.

Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.

Bearinger, J.P., et al., Nature Materials 2, 259-264, 2003

Black, C.T., IEEE 2005 Custom Integrated Circuits Conference, pp. 87-91.

Black, C.T., et al., IBM J. Res. & Dev., vol. 51, No. 5, Sep. 2007, pp. 605-633.

Black, Charles T., ACSNano, vol. 1, No. 3, 2007, American Chemical Society, pp. 147-150.

Black, Charles T., et al., IEEE Electronon Device Letters, vol. 25, No. 9, Sep. 2004, pp. 622-624.

Botelho do Rego, A.M., et al., Surface Science, 482-485 (2001), pp. 1228-1234.

Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).

Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).

Chandekar, Amol, et al., "Template-Directed Adsportion of block Copolymers on Alkanethiol-Patterned Gold Surfaces," (circa 2006), http://www.nano.neu.edu/industry/industry__showcase/industry__day/documents/Chandekar.pdf) (Powerpoint template for scientific posters (Swarthmore College)).

Cheng, Joy T., et al., Nano Letters, vol. 0, No. 0, A-E, published on Web Aug. 16, 2006.

Daoulas Kostas Ch., et al., Physical Review Letters 96, week ending Jan. 27, 2006, pp. 036104-1-3.

Desai, Dr. Trejal A., et al., Business Briefing: Medical Device Manufacturing & Technology, 2002.

Edwards, Erik W., et al., Journal of Polymer Science: Part B Polymer Physics, vol. 43, 3444-3459, 2005.

Edwards, Erik W., et al., Advanced Mater, 16, No. 15, Aug. 4, 2004, pp. 1315-1319.

Fasolka, Michael J. et al., Macromolecules 2000, vol. 33, No. 15, pp. 5702-5712.

Gates, Byron D., et al., Annu. Rev. Mater. Res. 2004, 34:339-72.

Ge, Zhenbin, et a., PRL 96, 186101-1-186101-4, The American Physical Society, week ending May 12, 2006.

Genua, A., et al., Nanotechnology, 18 (2007), pp. 1-7.

Gillmor, S.D., et al., Langmuir 2000, vol. 16, No. 18, 2000, pp. 7223-7228.

Hamley, I. W., "Introduction to Block Copolymers", Developments in Block Copolymers Science and Technology, 2004, John Wiley & Sons, Ltd., pp. 1-29.

Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.

Hutchison, J. Brian, et al., Chem. Mater., vol. 17, No. 19, 2005, pp. 4789-4797.

In, Insik, et al., Langmuir, vol. 22, No. 18, 2006, pp. 7855-7860.

Kim, Sang Ouk, et al., Nature, vol. 424, Jul. 24, 2003, pp. 411-414.

Kim, Sang Ouk, et al., Adv. Mater., 2007, 19, pp. 3271-3275.

Kim, Seung Hyun, et al., Macromolecules 2006, vol. 39, No. 24, 2006, pp. 8473-8479.

Kim, Seung Hyun, et al., Advanced Mater., vol. 16, No. 23-24, pp. 2119-2123, Dec. 17, 2004.

Krishnamoorthy, Sivashankar, et al., MaterialsToday, vol. 9, No. 9, Sep. 2006, pp. 40-47.

La, Young-hye, et al., Chem. Mater, 2007, vol. 19, No. 18, pp. 4538-4544.

Laracuente, A.R., et al., Surface Science 545, 2003, pp. 70-84.

Lentz, David, et al., "Whole Wafer Imprint Patterning Using Step and Flash Imprint Lithography: A Manufacturing Solutions for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.

Li, Mingqi, et al., MaterialsToday, vol. 9, No. 9, Sep. 2006, pp. 30-39.

Li, Xue, et al., ScienceDirect, Polymer 48 (2007), pp. 2434-2443.

Lin, Zhiqun, et al., Adv. Mater. 2002, 14 No. 19, Oct. 2, pp. 1373-1376.

Lin-Gibson, Sheng, et al., Macromolecules 2005, 38, pp. 2897-2902.

Malkoch, Michael, et al., Chem. Commun., 2006, pp. 2774-2776.

Mansky, P., et al., Science, vol. 275, Mar. 7, 1997, pp. 1458-1460.

Maye, Mathew A., et al., Journal of Chemical Education, vol. 79, No. 2, Feb. 2002, pp. 207-210.

Metters, Andrew, et al., Biomacromolecules 2005, 6, pp. 290-301, 2005.

Meyer, Evelyn, et al., Macromollecular Mater. Eng., 276/277, 2000, pp. 44-50.

Mezzenga, Raffaele, et al., Langmuir 2003, vol. 19, No. 20, 2003, pp. 8144-8147.

Mindel, Joseph., et al., "A Study of Bredig Platinum Sols", The Chemical Laboratories of New York University, vol. 65 pp. 2112, (1943).

Naito, et al., IEEE Transactions on Magnetics, vol. 38, No. 5, Sep. 2002, pp. 1949-1951.

Nealey, Paul F., et al., "Self-Assembling Resists for Nanolithography", IEEE 2005.

Nguyen, Kytai, et al., Biomaterials 23, 2002, pp. 4307-4314.

* cited by examiner

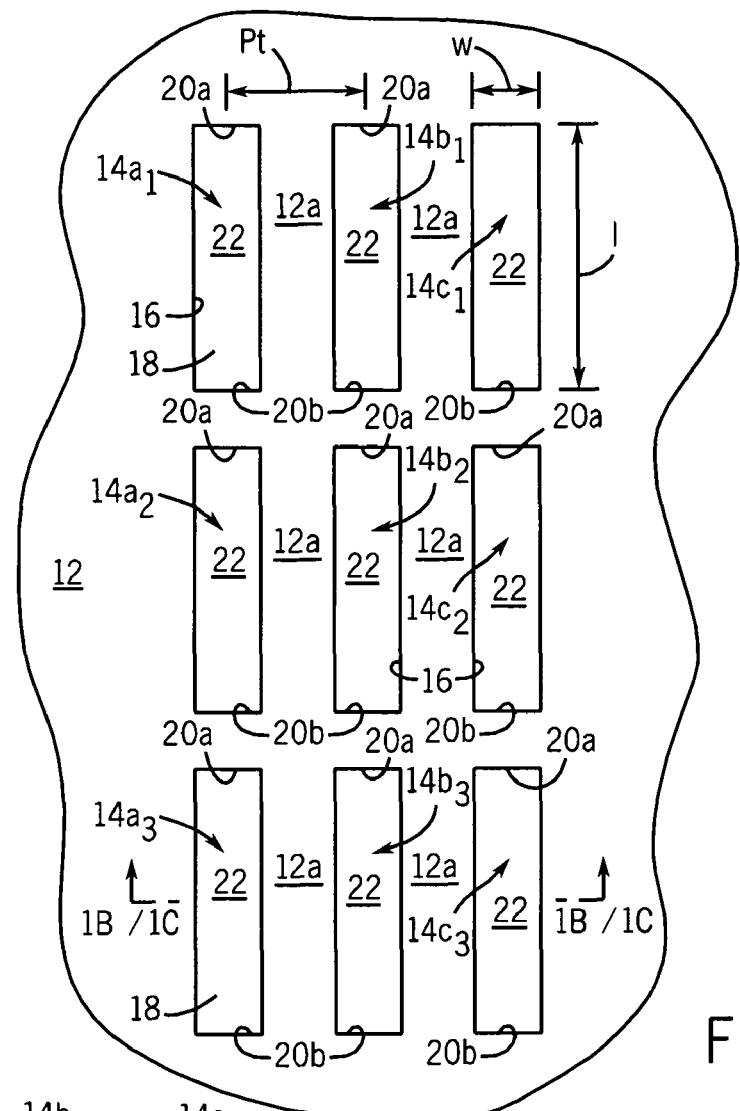
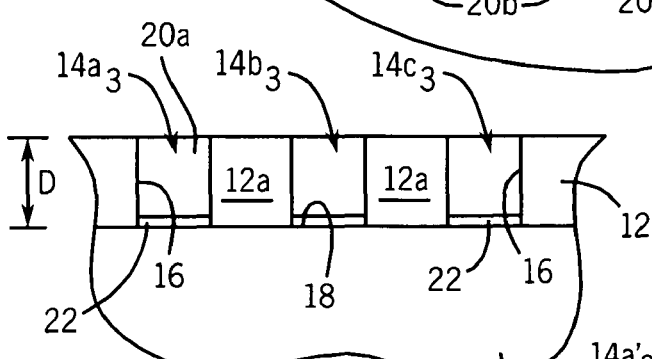
FIG. 1B
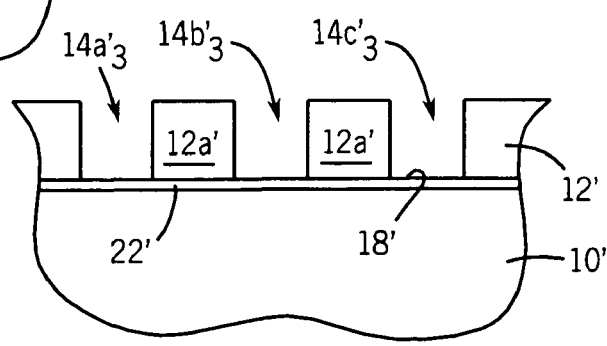
FIG. 1C
FIG. 1A

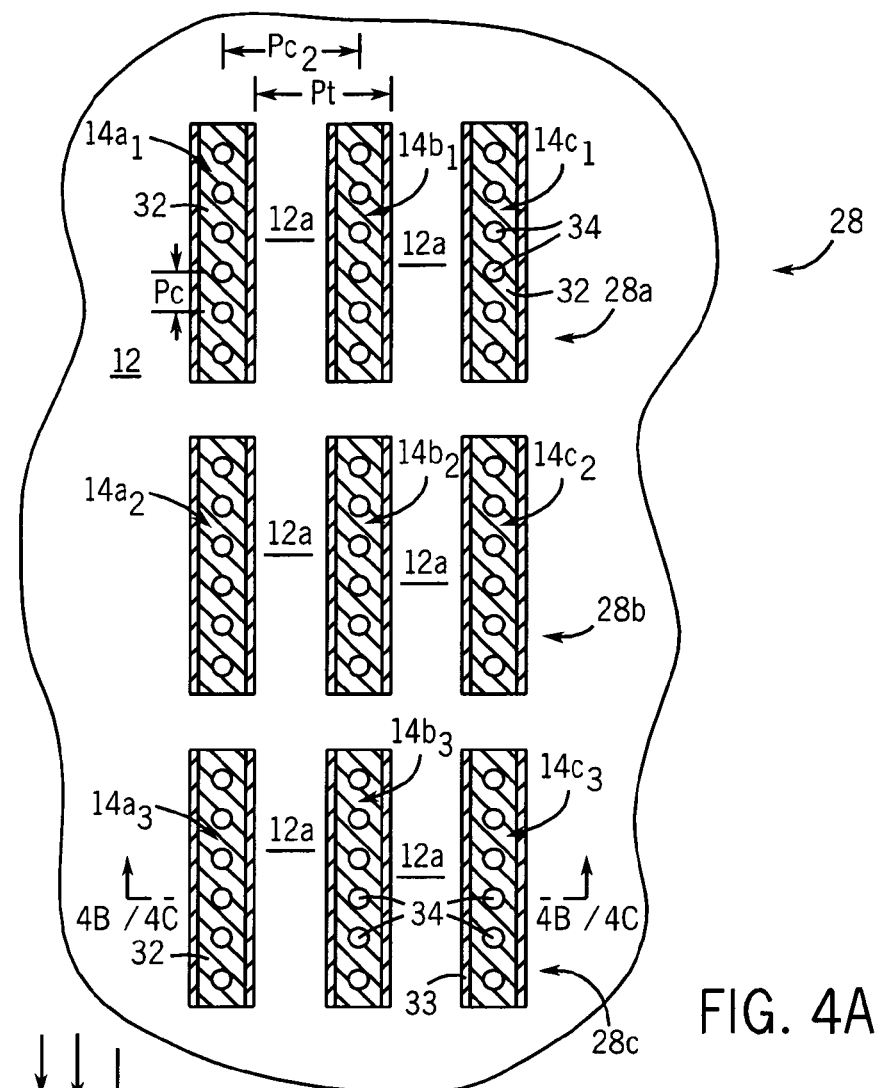
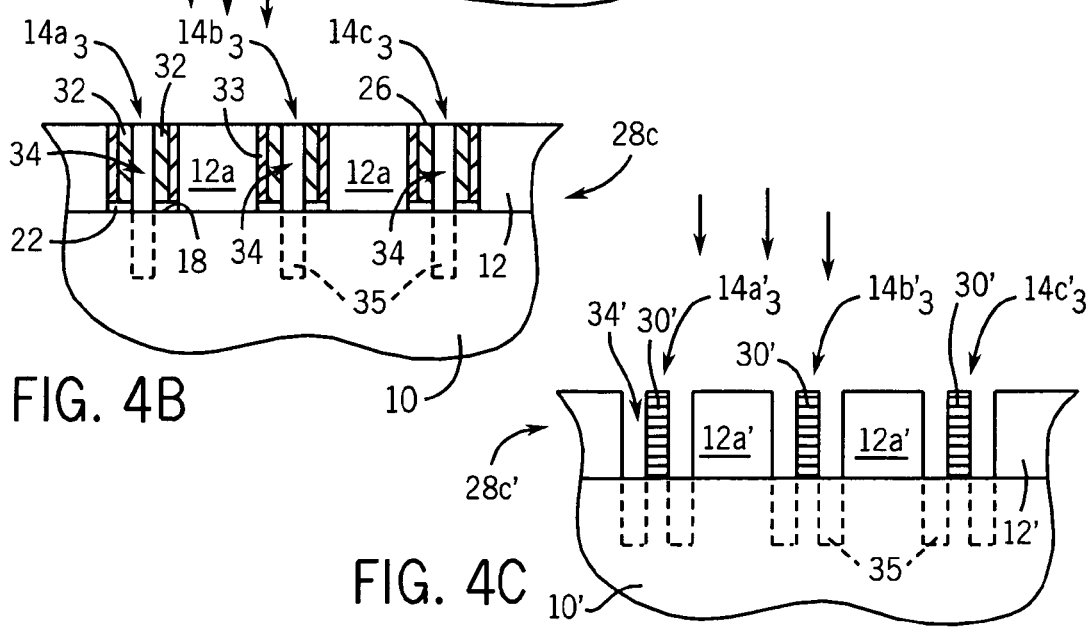
FIG. 4A
FIG. 4B
FIG. 4C

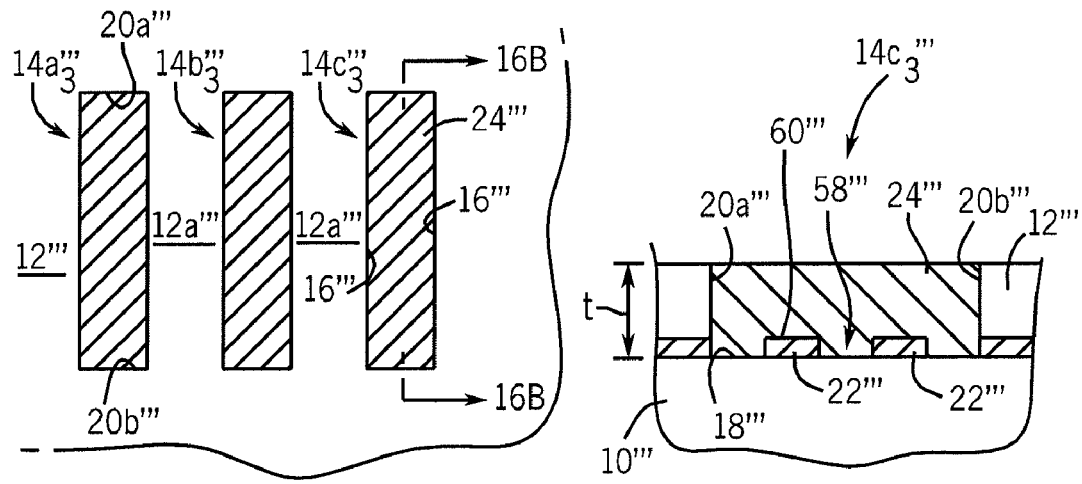
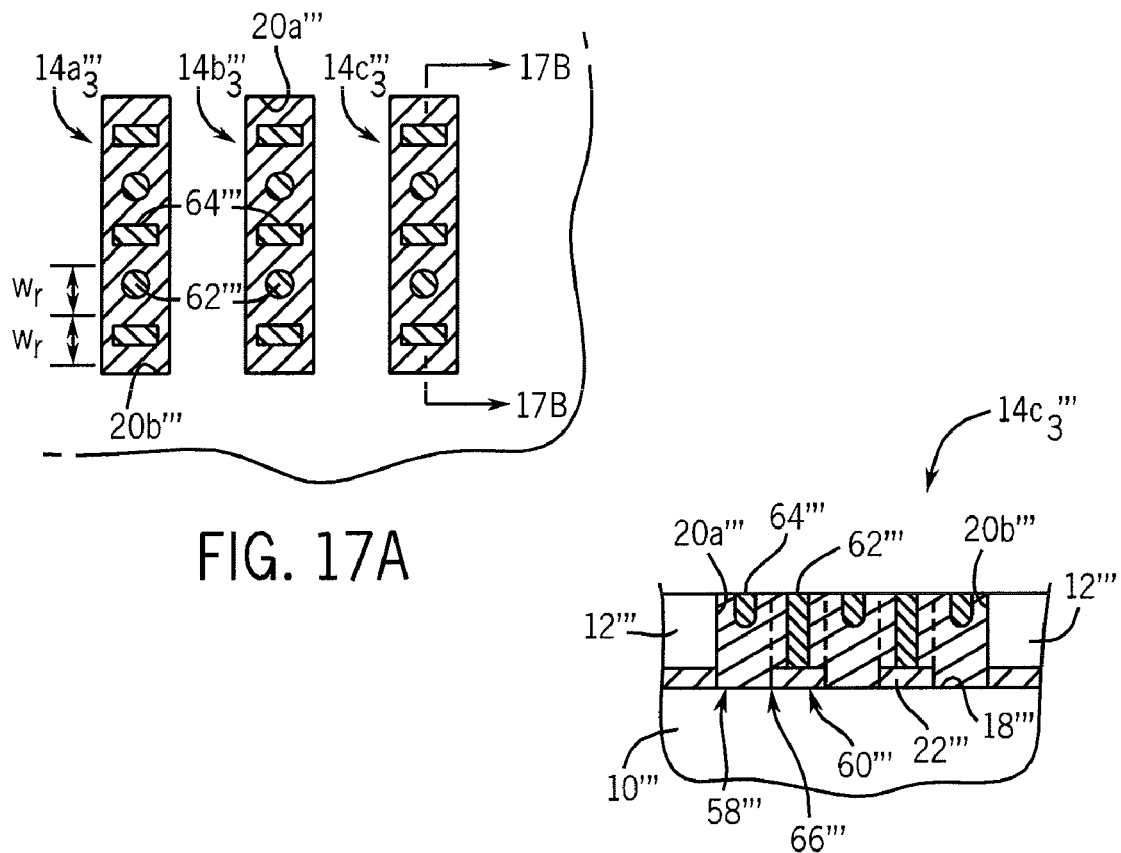

US 8,394,483 B2

TWO-DIMENSIONAL ARRAYS OF HOLES WITH SUB-LITHOGRAPHIC DIAMETERS FORMED BY BLOCK COPOLYMER SELF-ASSEMBLY

TECHNICAL FIELD

Embodiments of the invention relate to methods of fabricating nanostructures by use of thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Optical lithographic processing methods are not able to accommodate fabrication of structures and features at the nanometer level. The use of self-assembling diblock copolymers presents another route to patterning at nanometer dimensions. Diblock copolymer films spontaneously assembly into periodic structures by microphase separation of the constituent polymer blocks after annealing, for example by thermal annealing above the glass transition temperature of the polymer or by solvent annealing, forming ordered domains at nanometer-scale dimensions. Following self-assembly, one block of the copolymer can be selectively removed and the remaining patterned film used as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam (E-beam) lithography or EUV photolithography, which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Periodic cylindrical structures have been grown in parallel and perpendicular orientations to substrates. A primary requirement for producing perpendicular cylinders by thermal annealing is that the substrate floor must be neutral wetting to the blocks of the copolymer. Periodic hexagonal close-packed cylinders can be useful as etch masks to make structures in an underlying substrate for applications such as magnetic storage devices. However, that layout is not useful for making structures such as DRAM capacitors, which require a rectangular- or square-shaped array layout.

Graphoepitaxy techniques using substrate topography have been used in an attempt to influence the orientation, ordering and registration of the microphase-separated domains. Although one-dimensional arrays have been formed in trenches, no efforts have been made to address ordering of the domains over a large area, or to control the location and orientation of ordered domains in two dimensions.

Although there is a single report of forming ordered sphere-forming block copolymer films by Cheng et al. (*Nano Lett.*, 6 (9), 2099-2103 (2006)), these have been limited to one-dimensional ordered arrays with adjacent arrays not aligned, the cylinders being off-set along the y-axis in neighboring trenches.

It would be useful to provide methods of fabricating films of two-dimensional arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 1A-4A illustrate diagrammatic top plan views of a portion of a substrate during various stages of fabrication of a film composed of a two-dimensional rectangular array of perpendicular oriented cylinders in a polymer matrix according to an embodiment of the present disclosure. FIGS. 1B/1C-4B/4C are elevational, cross-sectional views of the substrate fragment depicted in FIGS. 1A-4A, taken along lines 1B/1C-1B/1C to lines 4B/4C-4B/4C, respectively.

FIGS. 5A-11C illustrate various stages of the fabrication of a film composed of a two-dimensional square array of perpendicular oriented cylinders in a polymer matrix according to another embodiment of the present disclosure. FIGS. 5A-5C illustrate elevational, cross-sectional views of a portion of a substrate during stages of producing a material layer. FIG. 6 is a cross-sectional view of the substrate depicted in FIG. 5C in a subsequent step with a self-assembling block copolymer material within trenches. FIGS. 7A-11A are diagrammatic top plan views of a portion of the substrate of FIG. 6, during subsequent stages of the fabrication of a film composed of a two-dimensional square array of cylinders in a polymer matrix. FIGS. 7B-11B are elevational, cross-sectional views of the substrate depicted in FIGS. 7A-11A, taken along line 7B-7B to line 11B-11B, respectively. FIG. 11C is a cross-sectional view of the substrate of FIG. 10A in a subsequent processing step showing selective removal of the matrix of the annealed film in another embodiment.

FIGS. 12A-18A illustrate diagrammatic top plan views of a portion of a substrate during various stages of fabrication of a film composed of a two-dimensional rectangular array of perpendicular oriented and parallel oriented cylinders in a polymer matrix according to another embodiment of the present disclosure. FIGS. 12B, 13B and 15B-18B are elevational, cross-sectional views taken along lines B-B of the substrate depicted in FIGS. 12A, 13A and 15A-18A, respectively. FIG. 14 is an elevational, cross-sectional view of the substrate of FIG. 13A in a subsequent processing step.

DETAILED DESCRIPTION OF THE INVENTION

Figure 2A:
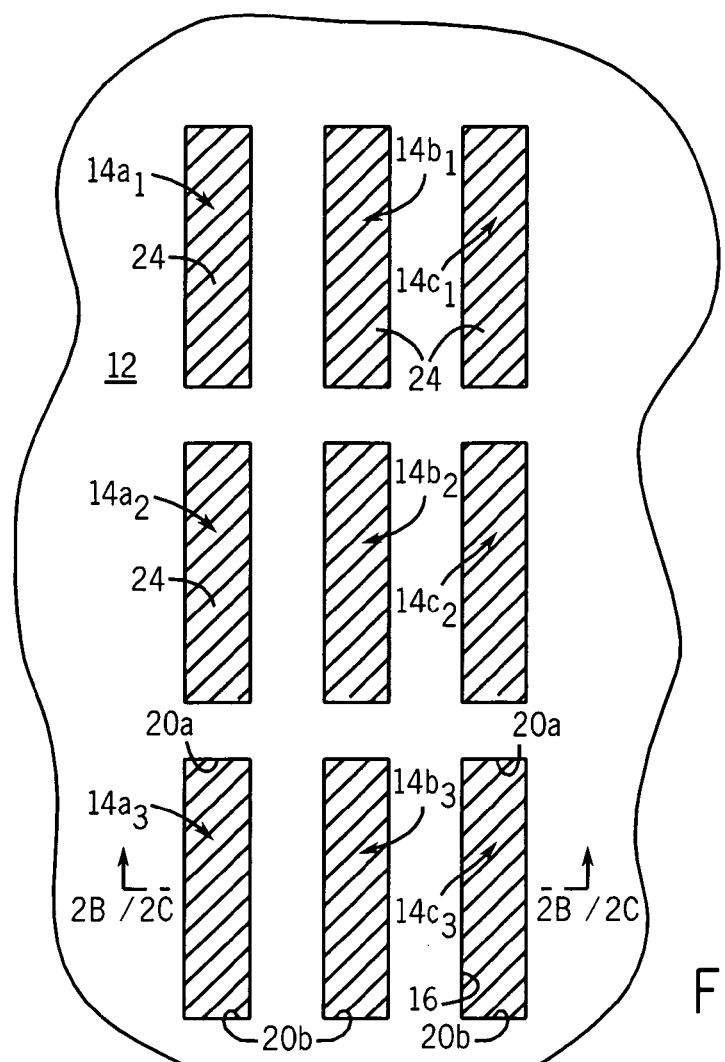

The following description with reference to the drawings provides illustrative examples of devices and methods according to embodiments of the invention. Such description is for illustrative purposes only and not for purposes of limiting the same.

In the context of the current application, the terms "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self assemble upon annealing from a self-assembling (SA) block copolymer or a blend of a block copolymer with one or more of its constituent homopolymers.

In embodiments of the invention, processing conditions are used that induce microphase separation of thin films of self-assembling cylindrical-phase diblock copolymers to produce 2-D rectangular and square arrays of nanoscale cylinders by constraining one dimension by graphoepitaxy and the second dimension either by graphoepitaxy or by chemically differentiating the trench floor.

Steps in a method for fabricating two-dimensional (2-D) rectangular arrays of cylinders oriented perpendicular to a substrate from thin films of cylindrical phase self assembling (SA) block copolymers according to an embodiment of the invention are illustrated in FIGS. 1A-4C. The described embodiment is a graphoepitaxy-only technique, which utilizes topographical features, the sidewalls and ends of trenches, as constraints to induce orientation and registration of perpendicularly-oriented cylindrical copolymer domains in both one dimension (single row parallel to the trench sidewalls) and a second dimension (cylinders registered between adjacent trenches) to achieve 2-D rectangular arrays of nanoscale microstructures in the form of cylinders within a polymer matrix.

Referring to FIGS. 1A and 1B, a substrate 10 with an overlying material layer 12 is provided, being a silicon layer 10 and a silicon oxide ($SiO_x$) layer 12 in the illustrated example.

To prepare a 2-D rectangular array of cylinders according to a first embodiment of a method of the invention, the material layer 12 is patterned to form an array of adjacently aligned trenches $14a_{1-3}$, $14b_{1-3}$, $14c_{1-3}$. Each trench is structured with sidewalls 16, a floor or bottom surface 18, a width (w), and a length (l). Substrate 10 is exposed as the floor 18 of the trench, and portions of the material layer 12 form a spacer interval 12a between the trenches. The width (w) of the trenches is equal to about the inherent pitch value ($L_o$) of the polymer, typically ranging from about 10-100 nm. The length (l) of the trenches is equal to about $nL_o$ ("$n*L_o$"), typically ranging from about n*10–n*100 nm (with n being the number of features or structures (i.e., cylinders)). First edges (ends or tips) 20a and second edges 20b of each adjacent trench (e.g., trenches $14a_1$-$14b_1$-$14c_1$) are aligned, as shown in FIG. 1A. As such, each adjacent trench is substantially the same the length (l). In some embodiments, the trench dimension is about 55-80 nm wide (w) and 1600-2400 nm in length (l). The depth (D) of the trenches can range from about 50-500 nm. The spacing or pitch distance ($p_t$) between adjacent trenches can vary but is at least $2L_o$.

The trenches can be formed using a lithographic tool having an exposure system capable of patterning at the scale of $L_o$ (10-100 nm). Such exposure systems include, for example, extreme ultraviolet (EUV) lithography, proximity X-rays, and electron beam lithography, as known and used in the art. Conventional photolithography can attain ~58 nm features.

The trench sidewalls 16 and edges 20a, 20b influence the structuring of the array of cylinders within the trenches. The boundary conditions of the trench sidewalls 16 impose order in the x-direction (x-axis) and ends 20 impose order in the y-direction (y-axis) to impose a structure wherein each trench contains n number of features (i.e., cylinders). Factors in forming a single 1-D array of cylinders aligned within the center and for the length of each trench include the width of the trench, the formulation of the block copolymer to achieve the desired pitch ($L_o$), and the thickness (t) of the copolymer film. To achieve a single array (row) of cylinders within each trench, the trench is constructed to have a width (w) of about the $L_o$ value of the polymer and a length (l) of $nL_o$. The application and annealing of a block copolymer material having an inherent pitch value of $L_o$ will result in a single array of "n" cylinders in the middle of a polymer matrix for the length (l) of the trench, with each cylinder being separated by a value of $L_o$.

For example, a block copolymer having a 35-nm pitch ($L_o$ value) deposited into a 75-nm wide trench will, upon annealing, result in a zigzag pattern of 35-nm diameter cylinders that are offset by a half distance for the length of the trench, rather than a single line of cylinders down the center of the trench. As the $L_o$ value of the copolymer is increased, for example, by forming a ternary blend by the addition of both constituent homopolymers, there is a shift from two rows to one row of cylinders within the center of the trench.

The lithographically defined alignment of the trench edges 20a, 20b imposes a second dimension of ordering such that each one-dimensional (1-D) array of cylinders (i.e., in trench $14b_1$) will line up with the adjacent 1-D arrays of cylinders (i.e., in trenches $14a_1$ and $14c_1$). Stresses due to trench length and/or width mismatch with the inherent pitch of the block copolymer can be relieved by elliptical variance from circularity in the x- or y-axis direction, as described, for example, by Cheng et al. (*Nano Lett.*, 6 (9), 2099-2103 (2006)).

As shown in FIGS. 1A and 1B, an array or string of three adjacent trenches $14a_1$-$14c_3$ has been etched into material layer 12 (e.g., oxide). The trenches $14a_1$-$14c_1$ are structured such that the surfaces of the sidewalls 16 and edges 20a, 20b are preferential wetting by the minority block of the copolymer and the trench floors 18 are neutral wetting (equal affinity for both blocks of the copolymer) to allow both blocks of the copolymer material to wet the floor 18 of the trench. Entropic forces drive the wetting of a neutral-wetting surface by both blocks, resulting in a perpendicular orientation of the self-assembled morphology.

A neutral wetting surface can be provided, for example, by applying a neutral wetting polymer to form a neutral wetting film 22 on the surface of the substrate 10 forming the trench floors 18, as illustrated in FIGS. 1A and 1B. In the use of a SA diblock copolymer composed of PS-b-PMMA, a random PS:PMMA copolymer brush layer (P(S-r-MMA)), which exhibits non-preferential or neutral wetting toward PS and PMMA can be applied by spin-coating onto the trench floor 18 (i.e., the surface of substrate 10). The brush can be affixed by grafting (on an oxide substrate) or by cross-linking (any surface) using UV radiation. In an embodiment shown in FIG. 1C, a random copolymer solution can be applied to substrate 10' as a blanket film 22' before deposition of the material layer 12'. For example, a random copolymer solution composed of PS and PMMA (58% PS) can be applied to the surface of the substrate 10 as a layer about 5-10 nm thick and end-grafted by heating at about 160° C. for about 48 hours. Etching through the material layer 12' to form the trenches 14' then exposes the underlying random copolymer film layer 22' as the floor 18' of the trench.

A surface that is neutral wetting to PS-b-PMMA can also be prepared by spin coating a photo- or thermally cross-linkable random copolymer such as benzocyclobutene- or azidomethylstyrene-functionalized random copolymers of styrene and methyl methacrylate (e.g., poly(styrene-r-benzo-cyclobutene-r-methyl methacrylate (P(S-r-PMMA-r-BCB)) onto the surface of the substrate 10 within the trenches and thermally cross-linking the polymer (e.g., 190° C., 4 hours) to form a cross-linked polymer mat. Capillary forces pull the random copolymer to the bottom of deep trenches. Non-crosslinked polymer material can be subsequently removed. In another embodiment, the cross-linkable polymer can be applied as a blanket film 22' to the substrate 10' before deposition of the material layer 12a', and exposed upon etching of the trenches $14a'_3$-$14c'_3$, as depicted in FIG. 1C. Another neutral wetting surface for PS-b-PMMA can be provided by hydrogen-terminated silicon, which can be prepared by a conventional process, for example, by a fluoride ion etch of silicon (with native oxide present, about 12-15 Å) (e.g., as substrate 10), for example, by immersion in aqueous solutions of hydrogen fluoride (HF) and buffered HF or ammonium fluoride ($NH_4F$), HF vapor treatment, etc., by exposure to hot $H_2$ vapor or by a hydrogen plasma treatment (e.g., atomic hydrogen).

The surface of the sidewalls 16 and the edges 20a, 20b of the trenches are preferential wetting by one of the components of the block copolymer to induce formation of the cylinders down the middle of each trench as the blocks self-assemble. For example, silicon oxide ($SiO_x$) exhibits preferential wetting toward the PMMA block to result in the assembly of a thin interface layer of PMMA on the trench sidewalls as well as PMMA cylinders in the center of a PS matrix within each trench. Other preferential wetting surfaces to PMMA can be provided, for example, by silicon nitride, silicon oxy-carbide, and PMMA polymer grafted to a sidewall material such as silicon oxide, and resist materials such as such as methacrylate based resists. Upon annealing, the PMMA block of the PS-b-PMMA copolymer layer will segregate to the sidewalls and edges of the trench to form a wetting layer (33 in FIGS. 3A-3C). The material layer 12 itself can be a preferential wetting material (e.g., $SiO_x$), although a layer of a preferential wetting material can be applied onto the surfaces of the trenches. For example, a polymethylmethacrylate (PMMA) that is modified with a moiety containing one or more hydroxyl (—OH) groups (e.g., hydroxyethylmethacrylate) can be applied by spin coating and then heating (e.g., to about 170° C.) to allow the terminal OH groups to end-graft to the oxide sidewalls 16 and edges 20a, 20b of the trenches. Non-grafted material can be removed from the neutral wetting layer 22 by rinsing with an appropriate solvent (e.g., toluene). See, for example, Mansky et al., *Science* 275: 1458-1460 (1997)).

Figure 2B:
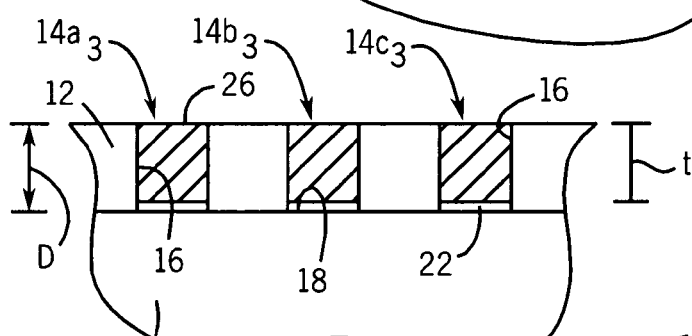

Referring now to FIGS. 2A and 2B, a cylindrical-phase SA block copolymer material 24 having an inherent pitch at or about $L_o$ (or a ternary blend of block copolymer and homopolymers blended to have a pitch at or about $L_o$) is then deposited, typically by spin casting (spin-coating), onto the floor 18 of the trenches. The block copolymer material can be deposited onto the patterned surface by spin casting from a dilute solution (e.g., about 0.25-2 wt % solution) of the copolymer in an organic solvent such as dichloroethane ($CH_2Cl_2$) or toluene, for example.

The copolymer material layer 24 is deposited into the trenches to a thickness (t) of less than or about equal to the $L_o$ value of the copolymer material to up to about $3L_o$, such that the copolymer film layer will self-assemble upon annealing to form a single row of perpendicular cylindrical domains having a diameter of about $L_o$ (e.g., 25-35 nm) in the middle of a polymer matrix within each trench. The film thickness can be measured, for example, by ellipsometry.

Figure 2C:
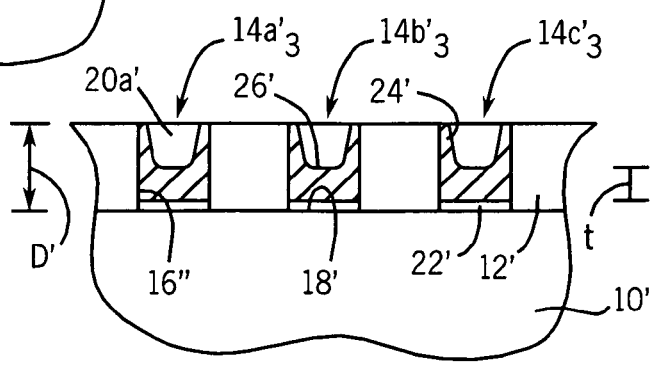

Depending on the depth (D) of the trenches, the cast block copolymer material 24 can fill the trenches as in FIG. 2B where the trench depth is about equal to $L_o$ (D~$L_0$), or form a thin film 24' over the trench floor 18' or optionally over the trench sidewalls 16' and edges 20a', 20b' as in FIG. 2C where the trench depth is greater than $L_o$ (D>$L_0$), e.g., a meniscus. The height (h) of the assembled cylinders (FIGS. 3B and 3C) corresponds approximately to the thickness (t) of the deposited copolymer material 24, 24' within the trench. Although not shown, a thin film of the copolymer material 24 can be deposited onto the surface of the oxide layer 12; this material will not self-assemble, as it is not thick enough to form structures.

Although diblock copolymers are used in the illustrative embodiment, other types of block copolymers (i.e., triblock or triblock or multiblock copolymers) can be used. Examples of diblock copolymers include poly(styrene-block-methyl methacrylate) (PS-b-PMMA), polyethyleneoxide-polyiso-prene, polyethyleneoxide-polybutadiene, polyethyleneoxide-polystyrene, polyetheleneoxide-polymethylmethacrylate, polystyrene-polyvinylpyridine, polystyrene-polyisoprene (PS-b-PI), polystyrene-polybutadiene, polybutadiene-poly-vinylpyridine, and polyisoprene-polymethylmethacrylate, among others. Examples of triblock copolymers include poly (styrene-block methyl methacrylate-block-ethylene oxide). An examples of a PS-b-PMMA copolymer material ($L_o$=35 nm) is composed of about 70% PS and 30% PMMA with a total molecular weight ($M_n$) of 67 kg/mol, to form ~20 nm diameter cylindrical PMMA domains in a matrix of PS.

The block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0% to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer.

Optionally, ellipticity ("bulging") can be induced in the structures by creating a slight mismatch between the trench and the spacer widths and the inherent pitch ($L_o$) of the block copolymer or ternary blend, as described, for example, by Cheng et al., "Self-assembled One-Dimensional Nanostructure Arrays,", *Nano Lett.*, 6 (9), 2099-2103 (2006), which then reduces the stresses that result from such mismatches.

Figures 3A, 3B, 3C:
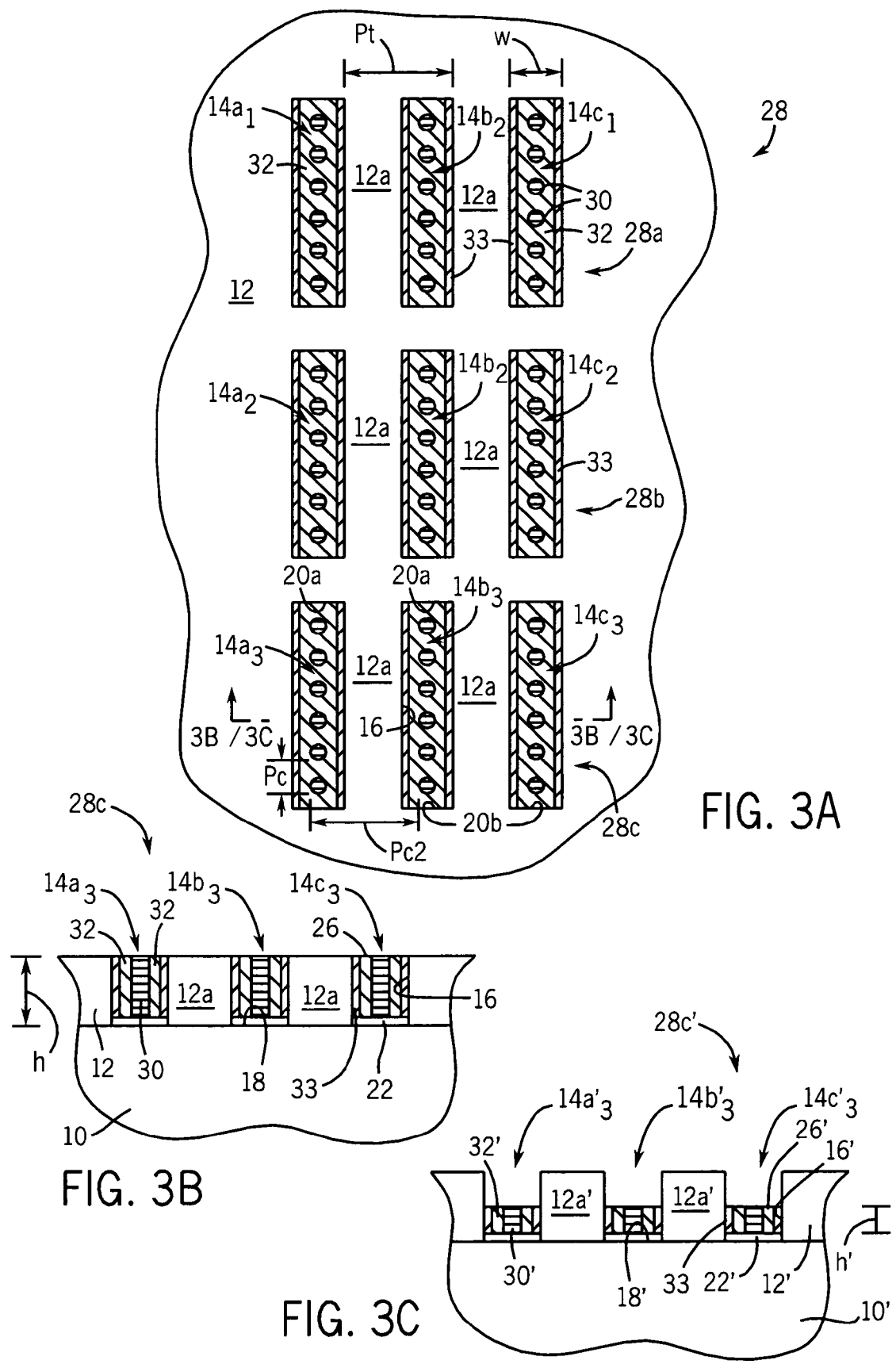

Referring now to FIGS. 3A and 3B, the block copolymer film 24 is then annealed as by thermal annealing above the glass transition temperature of the component blocks of the copolymer material to cause the polymer blocks to separate and self assemble according to the pattern of wettability on the underlying surfaces of the trenches to form the self-assembled block copolymer structure 28. For example, a PS-b-PMMA copolymer film can be annealed at a temperature of about 180-195° C. in a vacuum oven for about 1-24 hours to achieve the self-assembled morphology. The film can also be solvent annealed, for example, by slowly swelling both blocks of the film with a solvent, then slowly evaporating the solvent.

The annealed copolymer film comprises a rectangular array of perpendicularly oriented cylindrical domains 30 of a first block of the copolymer within a matrix 32 of a second block, the cylindrical domains in one dimension at a pitch distance of about $L_o$ and aligned with cylindrical domains in a second dimension at a pitch distance of about $2*L_o$. The annealed copolymer film can be contained within adjacently spaced apart trenches with the ends (edges) 20a, 20b of the trenches being aligned, and with the cylindrical domains within each trench in a single array and at a pitch distance of about $L_o$ and aligned with the cylindrical domains in adjacent trenches at a pitch distance of about $2*L_o$.

The constraints provided by the width (w) of trenches and the character of the copolymer composition combined with a neutral wetting trench floor 18 and preferential wetting sidewalls 18 and edges 20a, 20b, results, upon annealing, in a one-dimensional (1-D) array (single row) of perpendicularly-oriented, cylindrical domains 30 of PMMA within a matrix 32 of PS within each trench 14a-14c, with n structures according to the length of the trench, and a thin layer 33 of PMMA wetting the sidewalls 18.

The additional feature of the alignment of the trench edges 20a, 20b in combination with a pitch distance ($p_t$) of adjacent trenches substantially equal to $2L_o$, achieves two-dimensional (2-D) rectangular arrays 28a-28c of cylindrical domains 30 in which the pattern period or pitch distance ($p_c$) of the cylinders 30 within a single trench (e.g., $14a_3$) is substantially equal to $L_o$ and the pitch distance ($p_{c2}$) between the cylinders 30 of adjacent trenches (e.g., $14a_3$ and $14b_3$) is substantially equal to $2*L_o$ ($2L_o$) as depicted in FIG. 3A.

The resulting morphologies of the block copolymer (i.e., perpendicular orientation of cylinders) can be examined, for example, using atomic force microscopy (AFM), transmission electron microscopy (TEM), and scanning electron microscopy (SEM).

After annealing and the copolymer material is ordered, one of the block components can be selectively removed from the film, leaving either the cylindrical domains 30 (FIG. 4B) or the matrix 32 (FIG. 4C) resulting in rectangular arrays 28a-28c of openings or coverings (structures). After selective removal of one of the polymer domains, the resulting thin films can be used, for example, as a lithographic template or mask to pattern the underlying substrate 10 in a semiconductor processing to define regular patterns in the nanometer size range (i.e., about 10-100 nm).

For example, referring to FIGS. 4A and 4B, selective removal of the PMMA phase cylinders 30 will result in 2-D rectangular arrays of openings 34 within a thin film of polystyrene (PS) within the trenches $14a_1$-$14c_3$' with the oxide layer 12a remaining a spacer between each trench. Removal of the PMMA phase cylinders 30 can be performed, for example, by application of an oxygen ($O_2$) plasma, or by a chemical dissolution process such as acetic acid sonication by first irradiating the sample (ultraviolet (UV) radiation, 1 J/cm^2 254 nm light), then ultrasonicating the film in glacial acetic acid, ultrasonicating in deionized water, and rinsing the film in deionized water to remove the degraded PMMA.

In another embodiment illustrated in FIG. 4C, the selective removal of a PMMA phase matrix 32 will provide 2-D rectangular arrays of PS phase cylinders 30 and openings 34'. Such an embodiment would require a majority PMMA block copolymer and sidewalls composed of a material that is selectively PMMA-wetting (e.g. oxide).

The resulting porous PS film can be used as an etch mask to pattern (arrows ↓↓) the underlying substrate 10, for example, by a non-selective RIE etching process, to form a rectangular array of openings 35 in substrate 10 (shown in phantom in FIGS. 4A and 4B) for the fabrication of devices such as capacitors. Further processing can then be performed as desired.

A method according to another embodiment of the invention utilizing a graphoepitaxy-only technique is illustrated with reference to FIGS. 5A-11C, for forming two-dimensional (2-D) square arrays of perpendicularly-oriented cylinders in a polymer matrix.

In an embodiment to form a 2-D square array, a construction as described with reference to FIGS. 1A-1C can be provided, which includes a substrate 10' bearing a neutral wetting surface, for example, by application of a neutral wetting material layer 22", and an overlying material layer 12" having trenches $14a_{1-3}$"-$14c_{1-3}$" formed therein to expose the neutral wetting material layer 22" as the trench floors 18". In one embodiment, for example, a neutral wetting material layer 22" such as an end-grafted neutral wetting random (PS:PMMA) copolymer brush can be formed on the substrate 10", and then layer 12" deposited, as described with reference to FIG. 1C. Neutral wetting trench floors 18" can also be provided as H-terminated silicon, which can be prepared, for example, by a fluoride ion etch of a silicon substrate 10" (with native oxide present, about 12-15 Å), for example, by immersion in aqueous solutions of hydrogen fluoride (HF) and buffered HF or ammonium fluoride ($NH_4F$), HF vapor treatment, etc., or by exposure to hot $H_2$ vapor or by a hydrogen plasma treatment (e.g., atomic hydrogen). As in FIGS. 1A-1C, each trench $14a_{1-3}$"-$14c_{1-3}$" is separated by a spacer interval 12a" of the material layer 12" of a width ($w_i$) of about $L_o$.

In this embodiment, the sidewalls 16" of the material layer 12" are preferential wetting to the major block of the SA block copolymer, being PS in the illustrated example. Preferential wetting surfaces to PS can be provided, for example, by a metal such as gold or a PS-based photoresist containing a photoacid generator. For example, the material layer 12" itself can be composed of metal (e.g., gold), or the sidewalls 16" of the material layer 12" can be coated with a thin film of metal, for example, by evaporation, sputtering, or a spin-on technique, with removal of the metal from the trench floors 18" (e.g., by etching). For example, a metal (e.g., gold) layer of about 2-10 nm can be applied by thermal evaporation onto surfaces of the trenches formed within a material layer 12" of oxide, which surface can be precoated with a seed layer (e.g., chromium) as an adhesive interface.

Figure 5A:
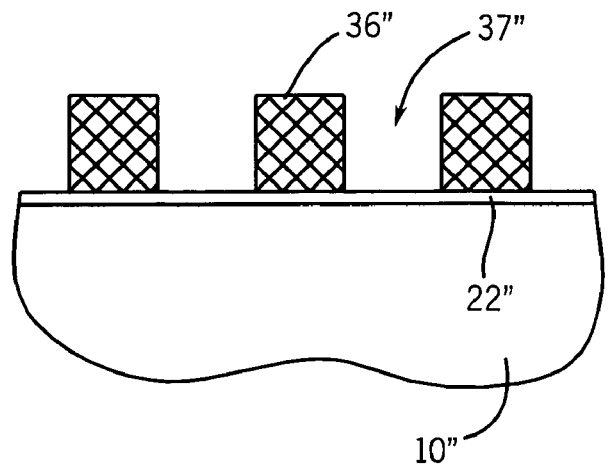
Figure 5B:
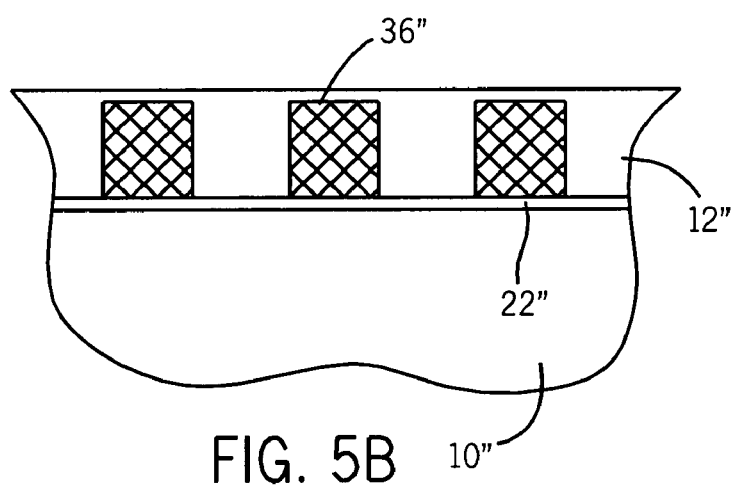
Figure 5C:
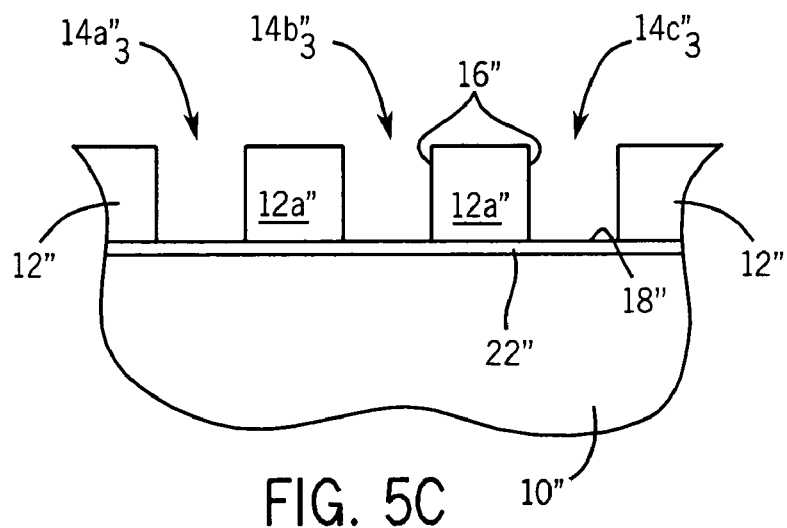

In an embodiment with reference to FIG. 5A, a neutral wetting layer 22" (e.g., a random copolymer, H-terminated silicon, etc.) is formed on the substrate 10". Then, as illustrated, a photoresist layer 36" is applied onto the neutral wetting layer 22", baked, patterned and developed to form a series of grooves 37". For example, a random copolymer brush of PS (58% vol.) and PMMA can be grafted onto a silicon substrate to provide a neutral wetting layer 22", and a PMMA resist 36" applied (e.g., by spin-coating), baked (about 130° C.) to remove residual solvent, patterned (e.g., by electron beam lithography), and developed by immersing in solvent. As shown in FIG. 5B, a layer of metal can then be deposited to form the material layer 12". The remaining photoresist 36" and overlying metal can then be removed. Such a liftoff process results in a structure as in FIG. 5C (and in top plan view in FIG. 1A). For example, a layer of chromium and of gold can be sequentially deposited by evaporation, and the PMMA photoresist and overlying deposited metal removed to result in gold features with grooves between the features. As shown, a series of metal features (e.g., gold) form the material layer 12" with sidewalls 16" and spacer intervals 12a" between adjacent trenches (e.g., between $14a_3$", $14b_3$", and $14c_3$"), and grooves or trenches $14a_{1-3}$"-$14c_{1-3}$" with the exposed neutral wetting layer 22" as the trench floors 18".

Upon annealing a block copolymer film (e.g., of PS-b-

Figure 7B:
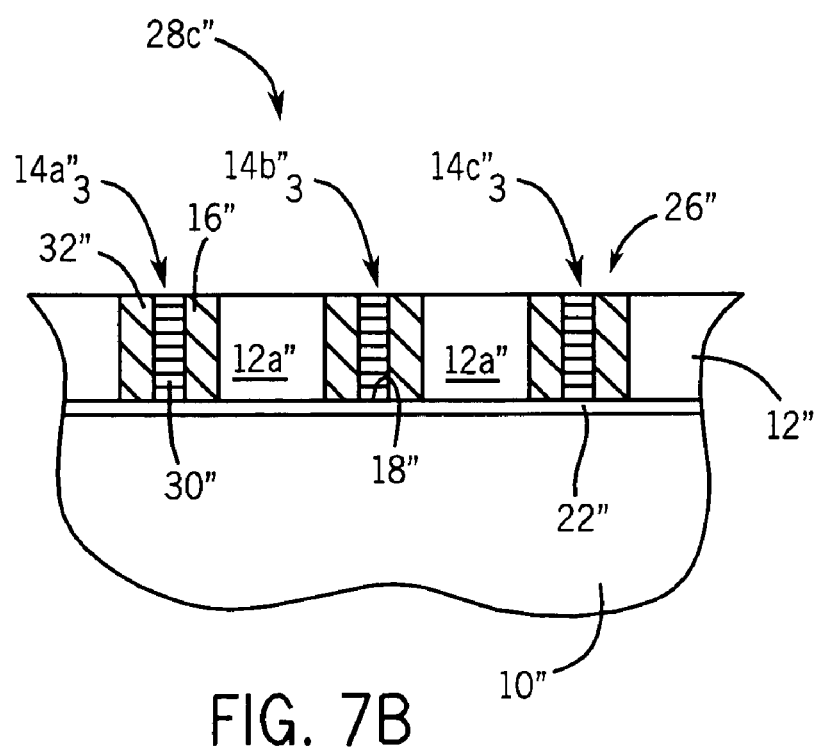
Figure 7A:
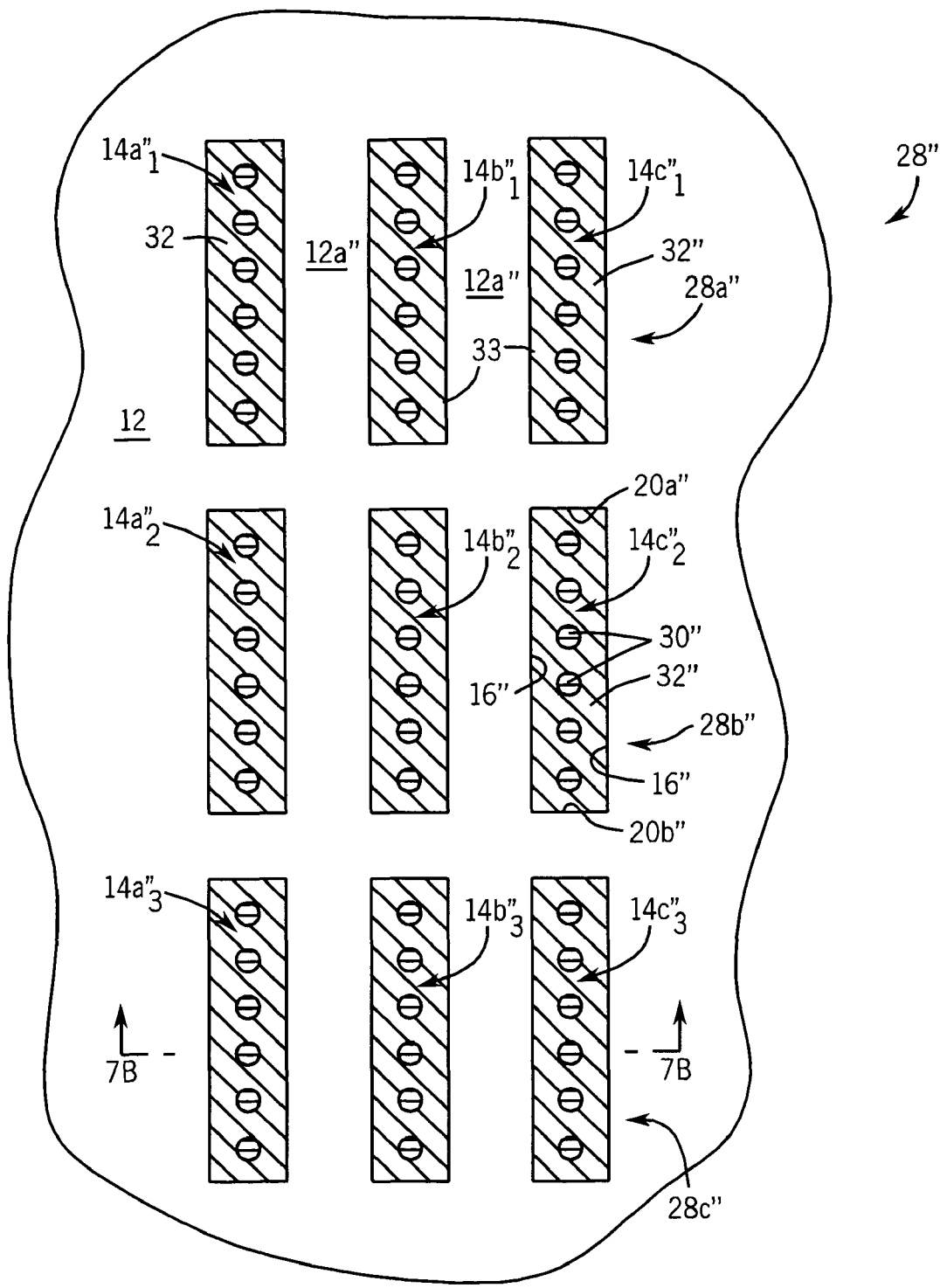

PMMA) within the trenches, the major block (e.g., PS) will wet the surface of the sidewalls of the trenches (as shown in FIGS. 7A and 7B).

Figure 6:
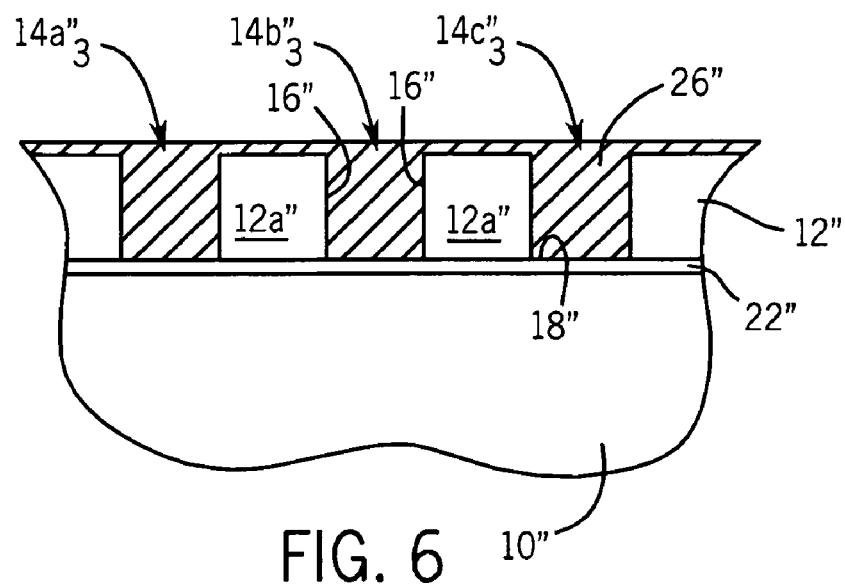

Referring now to FIG. 6, a cylindrical-phase SA block copolymer material 24" (as described with reference to FIGS. 2A and 2B) is then deposited into the trenches and annealed. The resulting self-assembled block copolymer structure 28", illustrated in FIGS. 7A and 7B, is composed of 2-D rectangular arrays 28a"-28c" of cylinders 30"of the minor block (e.g., PMMA) within a matrix 32" of the major block (e.g., PS), which also wets the sidewalls 16" of the trenches.

Following the annealing and ordering of the copolymer material 24", the polymer film 28" is cross-linked to fix and enhance the strength of the self-assembled polymer blocks. The polymers may be structured to inherently cross-link (e.g., upon UV exposure), or one or both of the polymer blocks of the copolymer material can be formulated to contain a cross-linking agent, which can be the same cross-linking agent if used in forming the neutral wetting film 22" on the trench floors 18" (as in the step of FIGS. 1A-1C).

Figure 8A:
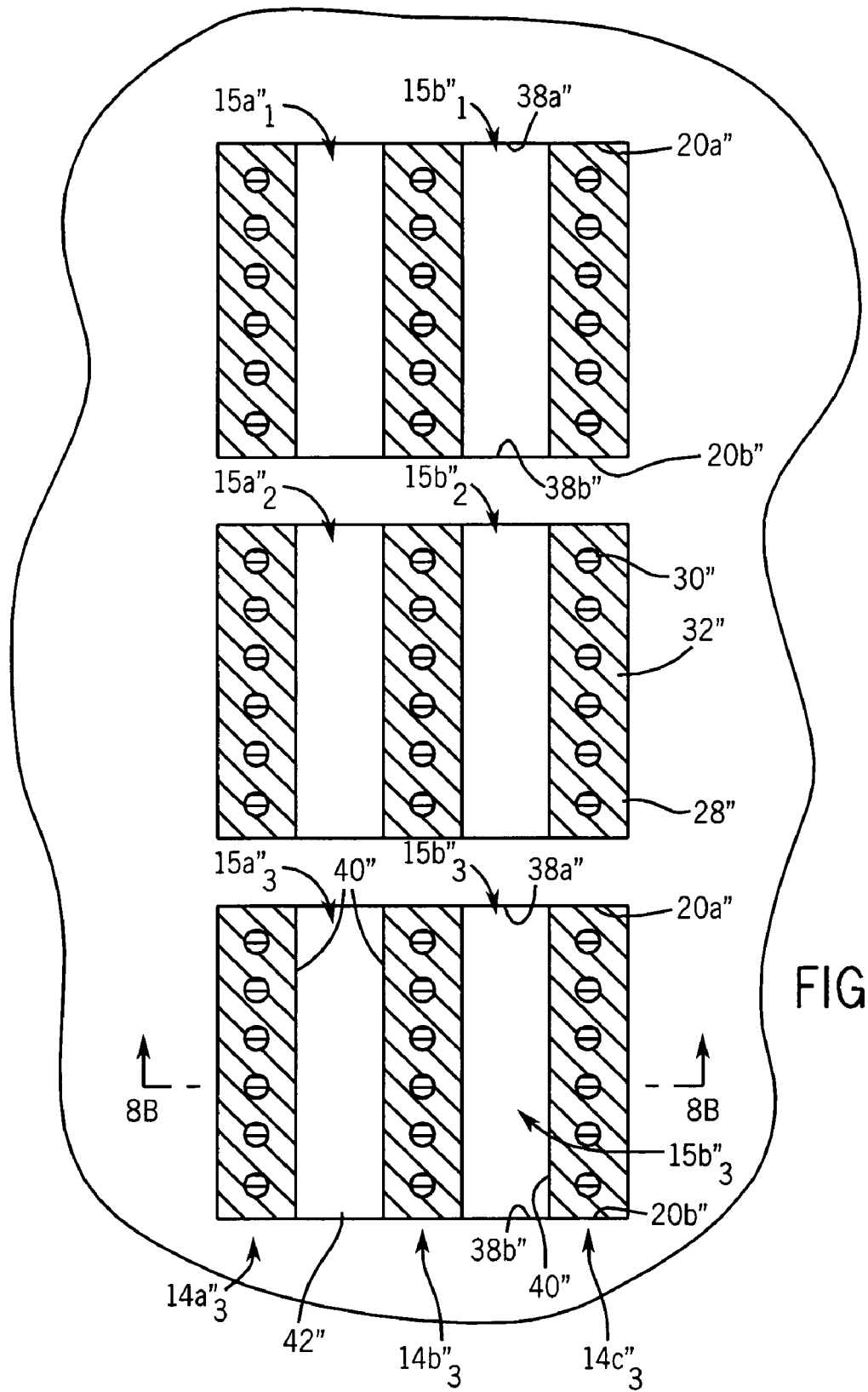
Figure 8B:
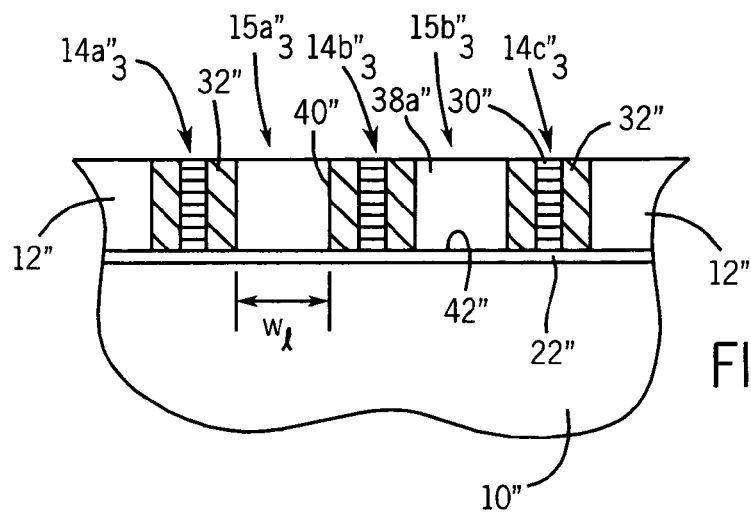

Referring now to FIGS. 8A and 8B, following the cross-linking of the film 28", the spacer interval 12a" of the material layer 12" (e.g., gold) situated between adjacent trenches (e.g., between $14a_3$", $14b_3$", and $14c_3$") is then removed, for example, by a selective wet etch with aqua regia, to produce an intermediate structure with new trenches $15a_{1-3}$"-$15b_{1-3}$" of width ($w_l$) at or about $L_o$. As illustrated, the removal exposes the matrix 32 composed of the major block (e.g., PS) to form the sidewalls 40" of the trenches 15", and exposes the neutral wetting layer 22" as the trench floors 42".

In an embodiment in which the material layer 12" is composed of a material such as silicon oxide ($SiO_x$), the spacer intervals 12a" can be removed, for example by a fluoride ion wet etch. In an embodiment in which the material layer 12" is composed of a negative resist such as a methacrylate-based photoresist, the spacer intervals 12a" between trenches 14a-14c" can be selectively developed and then removed by wet processing by applying an appropriate solvent to form new trenches 15a"-15b".

As shown, the spacer material 12a" has been removed to define the trench ends or edges 38a", 38b", and to expose the matrix 32" (e.g., of PS) of the first self-assembled block copolymer film 28" to define the sidewalls 40" of trenches 15a"-15b", which are preferential wetting. The removal of the spacer material 12a" is conducted so as not to damage or disrupt the integrity of the first self-assembled block copolymer structure 28". A residual amount of the spacer material 12a" (e.g. of gold) may remain (not shown) on the surface of the matrix 32" (i.e., sidewalls 40"). The trench edges 38a", 38b" are aligned with the edges 20a", 20b" of trenches 14a"-14c". As such, the length (l) of the trenches 14", 15" is $nL_o$.

Figure 9B:
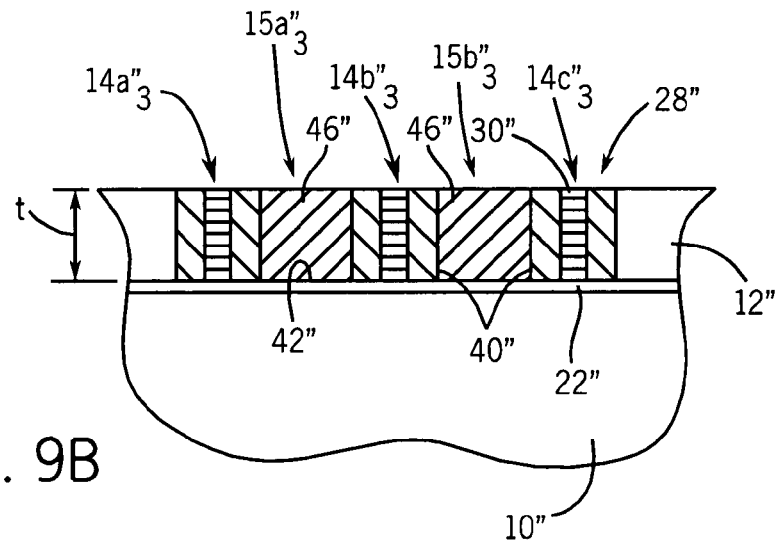
Figure 9A:
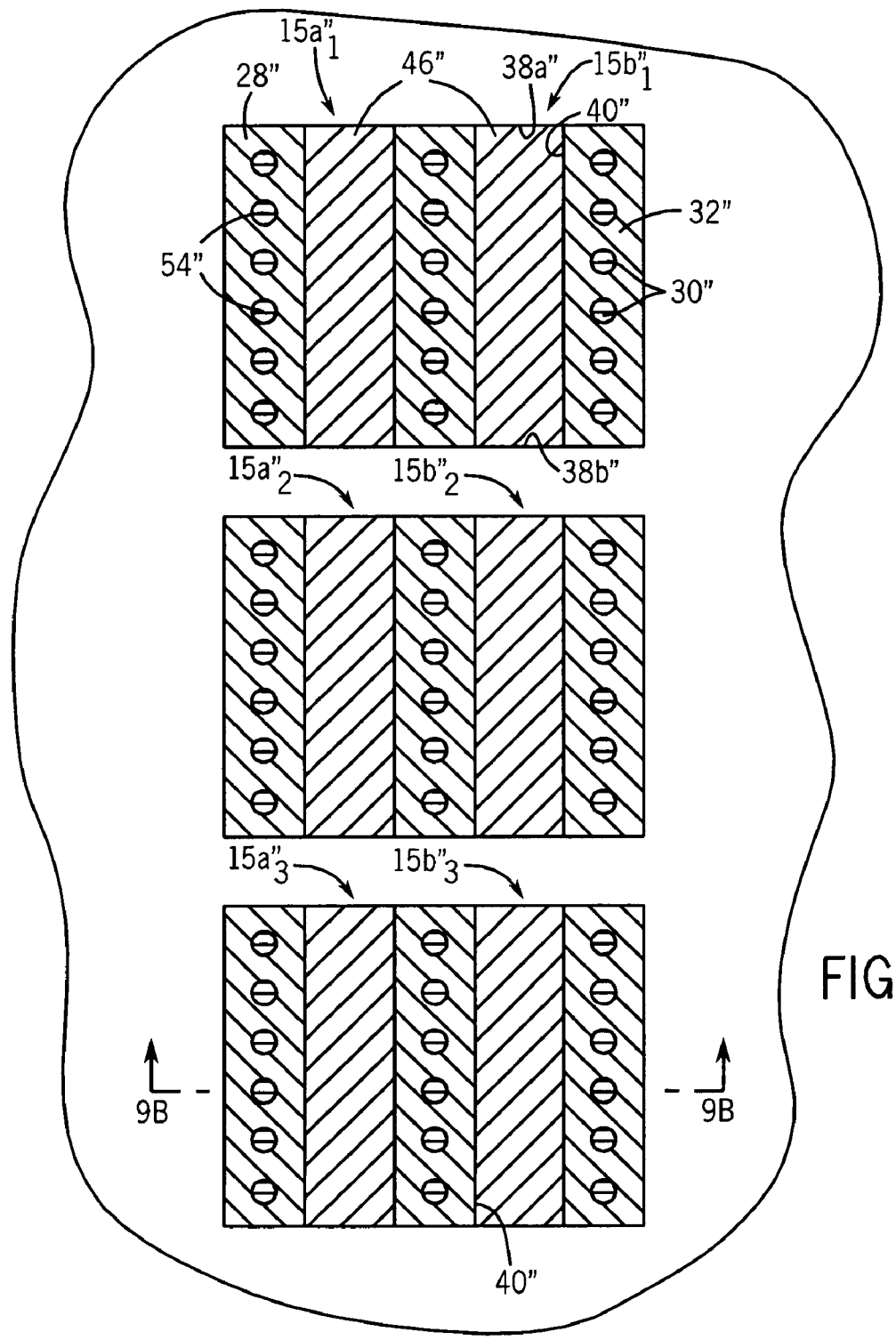

Next, as illustrated in FIGS. 9A and 9B, a second SA block copolymer material is deposited (e.g., by spin casting) as a film 46" into the newly formed trenches $15a_{1-2}$"-$15b_{1-2}$". The second block copolymer material 46" has a period of $L_o$ and is neutral wetting to the trench floors 42", and the major block (e.g., PS) of the second copolymer material is preferential wetting to the sidewalls 40" and trench edges 38", 38b". The second copolymer material 46" can be the same or a different composition than the first copolymer material 24". The thickness (t) of the cast copolymer film 46" is less than or about equal to the $L_o$ value of the second block copolymer material.

The first self-assembled major block (matrix 32", optionally with a residual amount of spacer 12a" (e.g., gold) thereon) which forms the sidewalls 40" of trenches 15a"-15b", provides a template or boundary condition in the x-axis (↔) for the registration of the self-assembling second copolymer film 46". In addition, the edges 38a", 38b" provide boundary conditions in the y-axis (↕). The trench floors 42" are neutral wetting, and the matrix 32" of the first assembled film is preferential wetting to the major block of the second copolymer, allowing graphoepitaxy and the formation of perpendicularly-oriented cylindrical domains within the trenches 15a"-15b". Optionally, ellipticity can be induced in the structures by creating a slight mismatch between the trench width and the inherent pitch ($L_o$) of the block copolymer or ternary blend, as previously described.

Figure 10B:
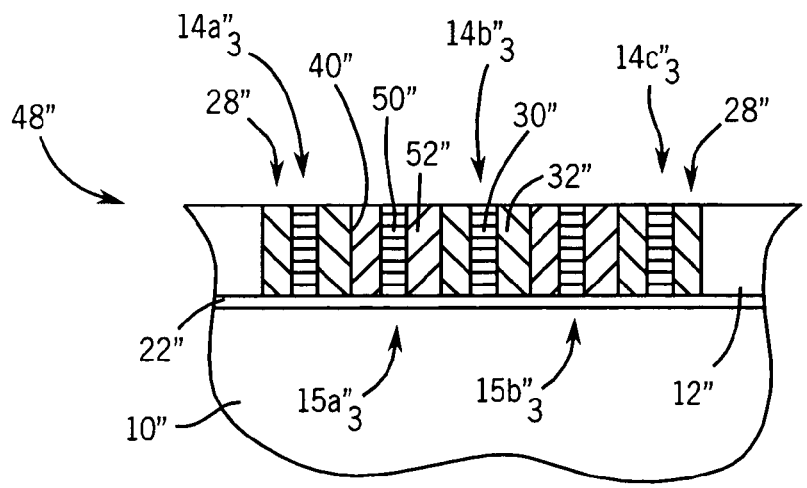
Figure 10A:
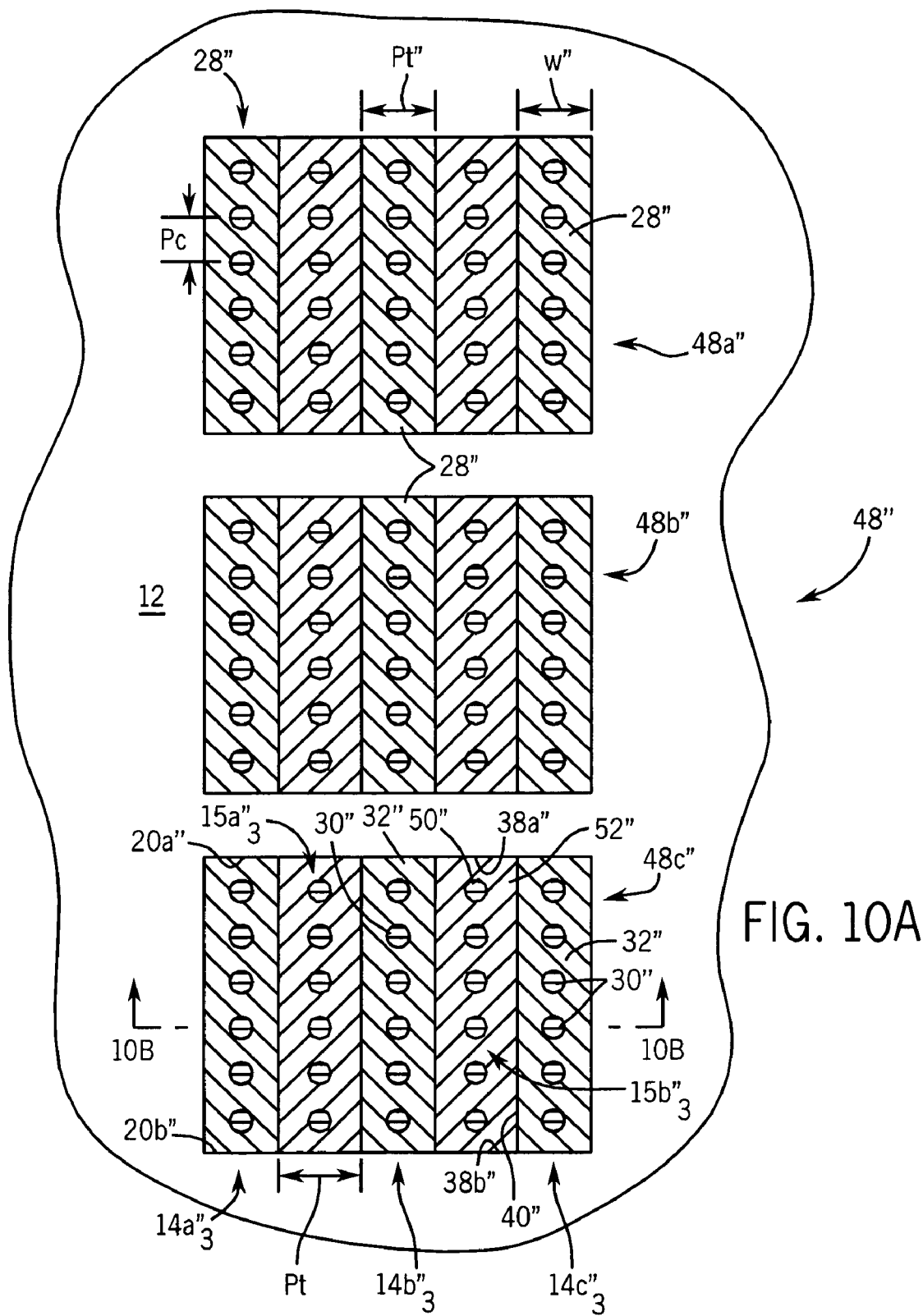

The second copolymer film 46" is then annealed to form the self-assembled block copolymer structure 48" depicted in FIGS. 10A and 10B. The earlier performed cross-linking step contributes to the structural integrity of the first self-assembled film 28" during the casting and annealing of the second block copolymer film. The annealed copolymer film comprises a square array of perpendicularly oriented cylindrical domains of a first block of the copolymer within a matrix of a second block, the cylindrical domains in one dimension in a single row at a pitch distance of about $L_o$ and aligned with cylindrical domains in a second dimension at a pitch distance of about $L_o$.

Upon annealing, the second block copolymer film self-assembles into 1-D arrays of perpendicularly-oriented (PMMA) cylindrical domains 50" (e.g., of PMMA) within a polymer matrix 52" (e.g., of PS), which are registered to the sidewalls 40" (matrix 32") of the trenches $15a_{1-2}$"-$15b_{1-2}$", with the major polymer block (matrix 52", e.g., of PS) wetting the sidewalls 40". Each cylinder 50" is spaced apart within each trench 15a"-15b") by a pitch distance ($p_c$") of $L_o$. The cylinders 50" are also registered to and aligned with the cylinders 30" within trenches 14a"-14c".

The alignment of the trench edges 38a", 38b" with edges 20a", 20b" of the first set of trenches 14a"-14c" in combination with a trench width (w) and trench pitch ($p_t$) between adjacent trenches (e.g., $14a_3$", $15a_3$", $14b_3$", etc.) of about $L_o$ produces a self-assembled film 48" containing two-dimensional (2-D) square arrays 48a"-48c" of cylinders 30", 50", with each cylinder within an array being separated by a pitch distance ($p_c$) of $L_o$.

Figure 11A:
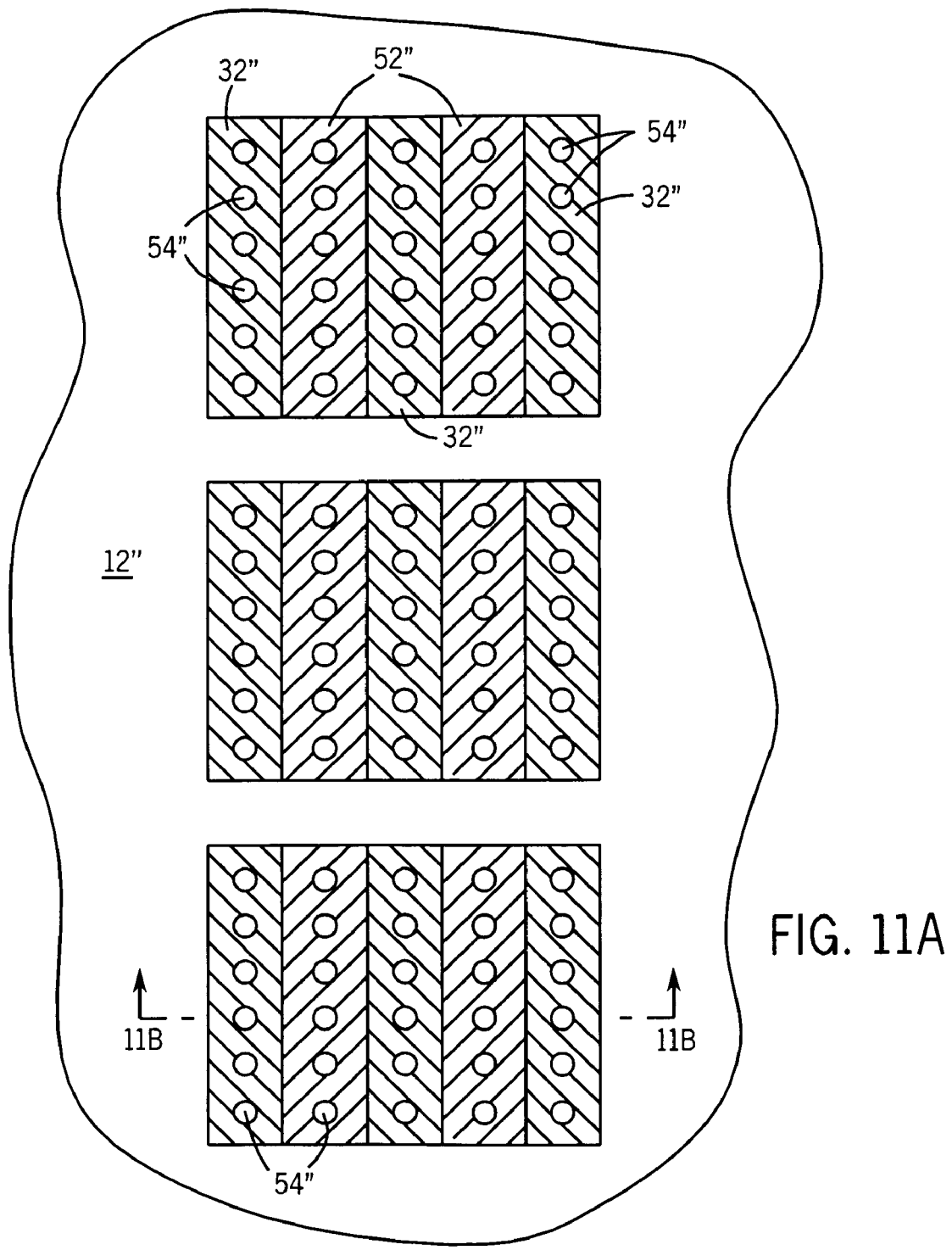
Figure 11B:
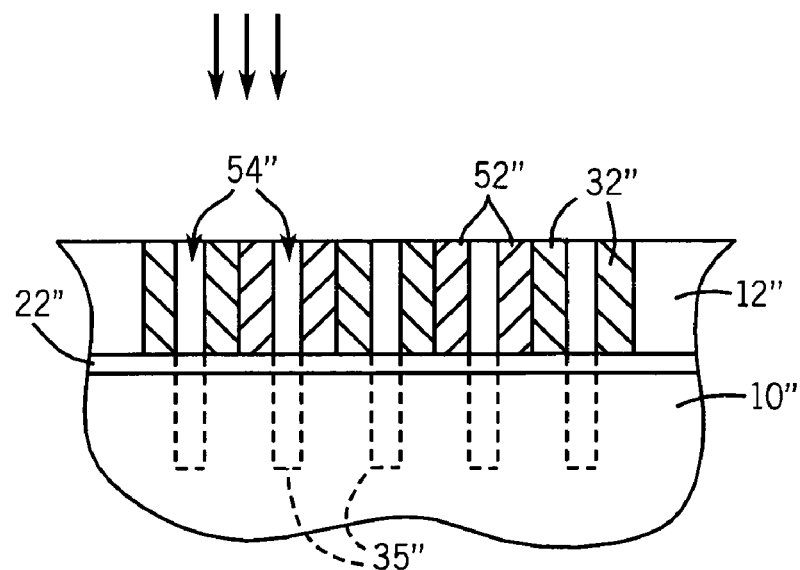
Figure 11C:
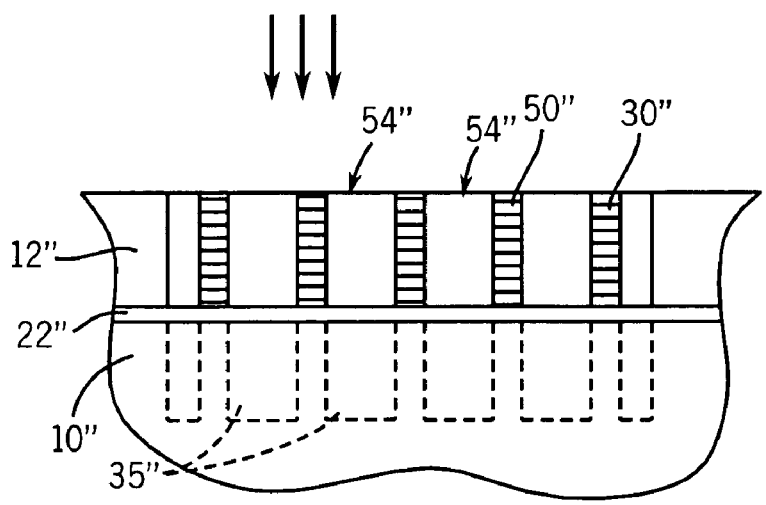

Referring now to FIGS. 11A and 11C, selective removal of one of the polymer domains (i.e., matrix or cylinders) can then be performed to produce a template for use in patterning the substrate 10". For example, selective removal of the cylindrical domains 30", 50" (e.g., of PMMA) will produce 2-D square arrays of openings 54" contained within a polymer matrix 32", 52" (e.g., of PS), as in FIGS. 11A and 11B. Selective removal of the matrix phase 32", 52" of the film will provide 2-D square arrays of cylinders 30", 50" and openings 54", as shown in FIG. 11C. The resulting film can be then used in patterning (arrows ↓↓) substrate 10" to form openings 35" in substrate 10" (shown in phantom). Processing can then be continued as desired.

Another method according to an embodiment of the invention, illustrated with reference to FIGS. 12-18, utilizes both graphoepitaxy (topographic features) and chemical pattern transfer techniques to form a film composed of 2-D rectangular arrays of parallel- and perpendicular-oriented cylinders in a polymer matrix. Graphoepitaxy is used to form arrays in one dimension, and a chemical pattern transfer technique is used to control formation of the arrays in a second dimension.

In the present embodiment, chemical pattern transfer is applied to differentiate and create patterns of wetting preferences in discrete areas on the floors of adjacently positioned trenches as a series of stripes oriented perpendicular to the trench sidewalls. The differing wetting patterns impose ordering on block copolymer films that are then cast on top of the substrate and annealed.

Figures 12A, 12B:
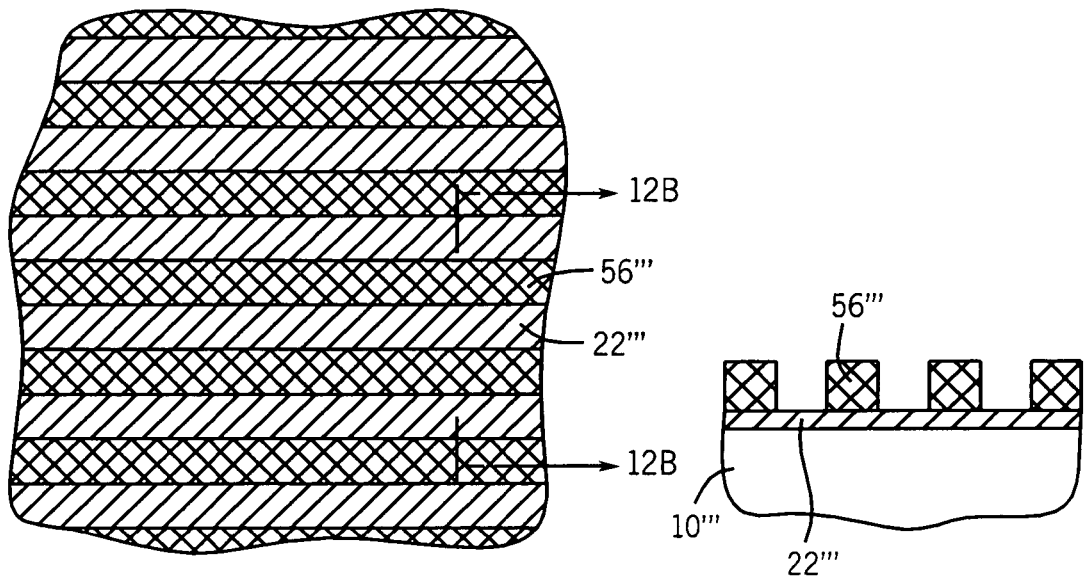

As shown in FIGS. 12A and 12B, in a first step of preparing a patterned or chemically activated surface on the trench floor (18'''), a neutral wetting random copolymer brush 22''' (e.g., a random PS-r-PMMA polymer) is coated onto a substrate 10''', which can be an inherently preferential wetting material such as silicon (with native oxide), oxide (e.g., silicon oxide, $SiO_x$), or inorganic film. The brush layer 22''' is coated with a layer of photoresist 56''', which is patterned as shown, by optical lithography or other suitable method. The polymer brush layer 22''' is then etched using the patterned resist layer 56'' as a mask to expose the underlying preferential wetting substrate 10''', and the resist layer 56''' is removed.

In another embodiment, layer 22''' is composed of a photo-crosslinkable neutral wetting polymer as described, for example, in U.S. Pat. No. 6,890,703 and U.S. Pat. No. 6,992,115 (Hawker et al.), which can be photoexposed and selectively cross-linked in the desired regions 60''' by exposure to light through a reticle. In another embodiment, selective cross-linking of the neutral wetting layer 22''' in defined sections 60''' can be performed with the use of a patterned photoresist mask. The non-crosslinked regions can then be removed by wet processing using an appropriate solvent.

Figures 13A, 13B:
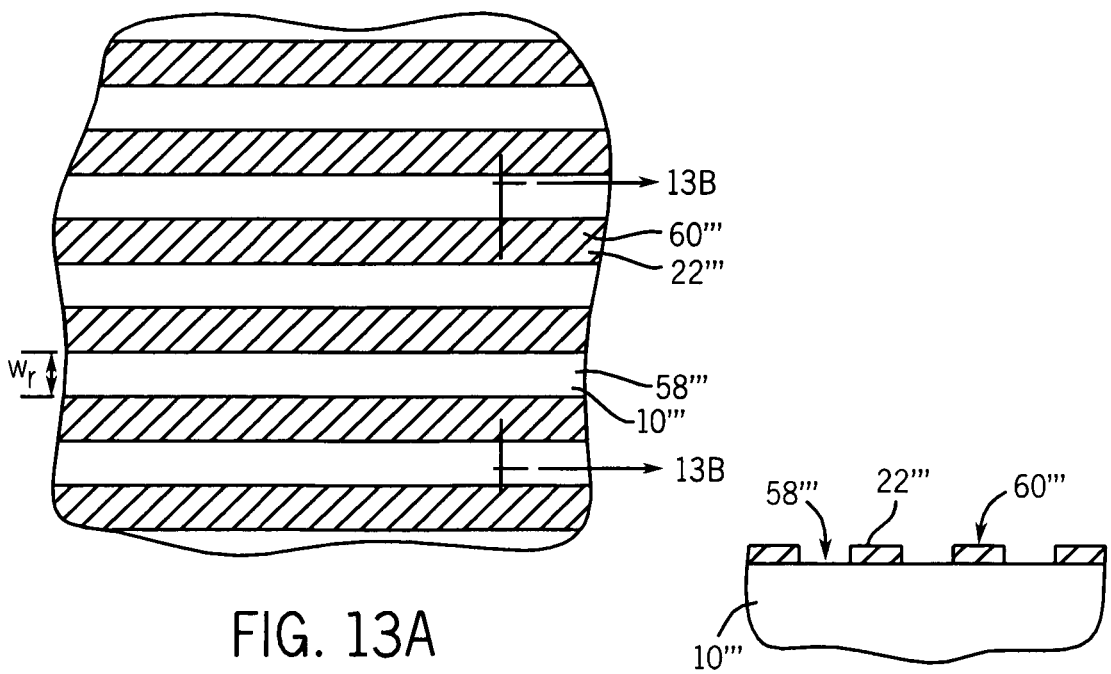

The resulting structure, depicted in FIGS. 13A and 13B, is patterned with discrete sections 58''' of the exposed preferential wetting substrate 10''' (e.g., silicon with native oxide) adjacent to discrete sections 60''' of the neutral wetting polymer layer 22'''. In some embodiments, the floor pattern is a series of stripes, the neutral wetting stripes or sections 60''' with a width ($w_r$) at or about $nL_o$ and the preferential wetting stripes or sections 58''' with a width ($w_r$) at or about Lo. In another embodiment, each of the sections 58''', 60''' has a width ($w_r$) at or about $L_o$.

Figure 14:
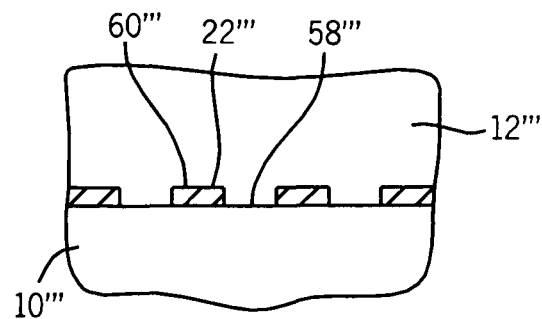
Figure 15A:
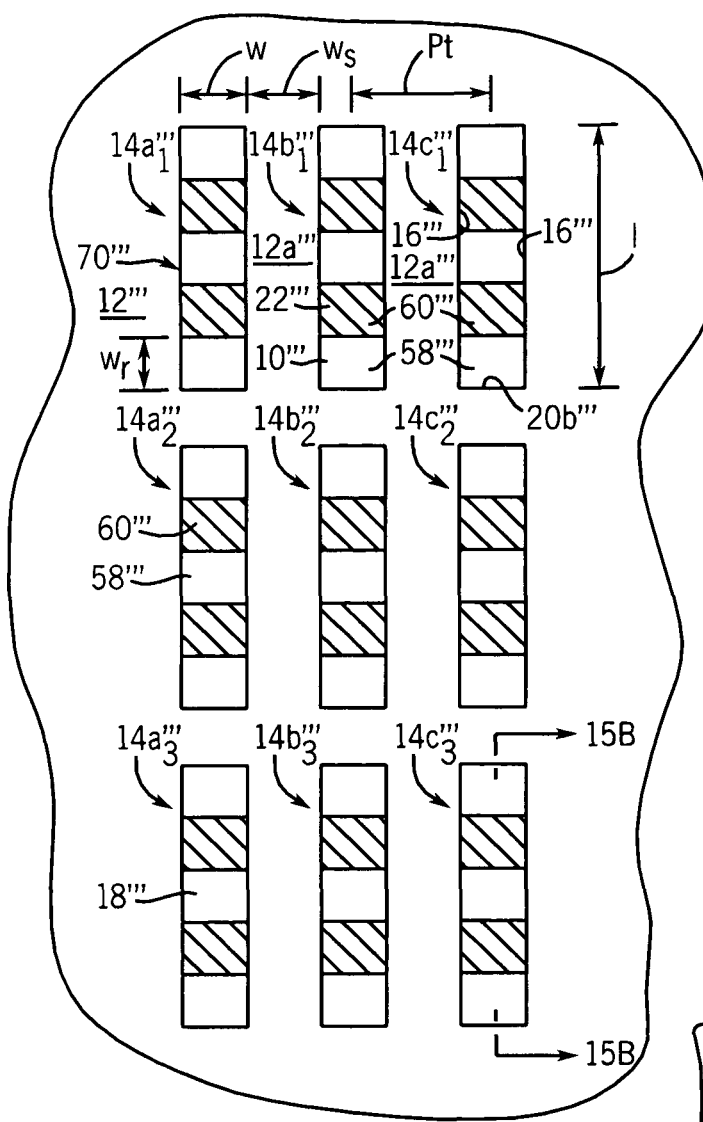
Figure 15B:
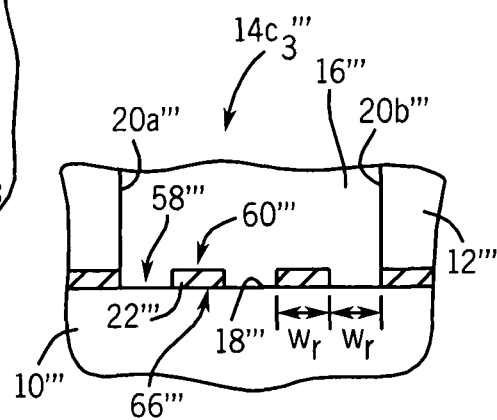

A material layer 12''' (e.g., of $SiO_x$) is then deposited over the substrate as illustrated in FIG. 14, and patterned with a series of trenches to expose the patterned substrate 10 as the floor of the trenches, as shown in FIGS. 15A and 15B. In another embodiment, the material layer 12''' can be deposited on the substrate 10''', the trenches etched into the material layer to expose the substrate, and the neutral polymer layer 22''' deposited onto the floors of the trenches, masked and then etched to expose sections 58''' of the substrate 10''' within the trenches.

As illustrated in FIG. 15A, the structure has been patterned with three sets of adjacent trenches $14a_{1-3}$'''-$14c_{1-3}$''' of width (w) at or about $L_o$ and a length (l) of about $nL_o$. The widths ($w_s$) of the spacer interval 12a''' of the material layer 12''' between adjacent trenches (e.g., between $14a_3$''', $14b_3$''', $14c_3$''', etc.) is constant and at least $L_o$, being $L_o$ in the present example. Thus, the pitch distance ($p_t$) of adjacent trenches is about $2*L_o$.

The trench sidewalls 16''' and edges 20a''', 20b''' (e.g., of $SiO_x$) are preferential wetting to one block (e.g., PMMA) of the copolymer. The trench floors 18''' are defined by the alternating preferential wetting sections 58''' (substrate 10''') and neutral wetting sections 60''' (e.g., random copolymer brush 22''').

Referring now to FIGS. 16A and 16B, with the trench floors chemically patterned, a block copolymer 24''' with cylindrical morphology of pitch $L_o$ or a ternary blend of a block copolymer and homopolymers formulated to have pitch $L_o$ can then be cast into the trenches to a film thickness (t) of about $L_o$ and annealed. As depicted in FIGS. 17A and 17B, the block copolymer film will then self assemble in each trench into a 1-D array of a perpendicular-oriented cylindrical domain 62''' (or a string of such perpendicular domains) extending the width ($w_r$) of each neutral wetting polymer section 60''' situated between a parallel-oriented cylindrical domain 64''' (half-cylinder) (or string of such parallel domains) extending the width ($w_r$) of each preferential wetting section 58'''.

The annealed copolymer film comprises a rectangular array of cylindrical domains of a first block of the copolymer within a matrix of a second block, the cylindrical domains in one dimension comprising a series of n perpendicular-oriented cylinders domains 62''' between two parallel-oriented cylindrical domains 64''' in a single row at a pitch distance of about $L_o$, with the cylindrical domains aligned with cylindrical domains in a second dimension at a pitch distance of about $2*L_o$. The annealed copolymer film can be contained within adjacently spaced apart trenches of length $m*(n+1)*L_o$ with the ends (edges) 20a''', 20b''' of the trenches being aligned, and with the cylindrical domains within each trench in a single array and at a pitch distance of about $L_o$ and aligned with the cylindrical domains in adjacent trenches at a pitch distance of about $2*L_o$, such that the single array within each trench comprises a perpendicular oriented cylinder 62''' or n cylinders between two parallel-oriented cylinders 64'''.

The edge 66''' between the sections 58''', 60''' provides a boundary condition for the sharp transition between parallel- and perpendicular-oriented cylinders and imposes order in one-dimension (1-D) within each trench. The resulting structure is an ordered 1-D array of alternating perpendicular- and parallel-oriented cylinders for the length ($nL_o$) of each trench. Alternatively, the structure is a repeating series of n perpendicular cylinders separated by a region of parallel cylinder morphology, e.g., the trench length is $m*(n+1)*L_o$, where m is the number of preferential-wetting chemically patterned stripes and n is the number of features or structures (e.g., where m and n are independently 1-50).

The inversion from perpendicular to parallel cylinders that occurs at the boundary edges 66''' imposes a second dimensional constraint whereby the structures in adjacent trenches (rows) are also aligned in a second dimension. The resulting structure is a 2-D rectangular array of sublithographic cylindrical structures in alternating perpendicular and parallel orientations.

Figure 18A:
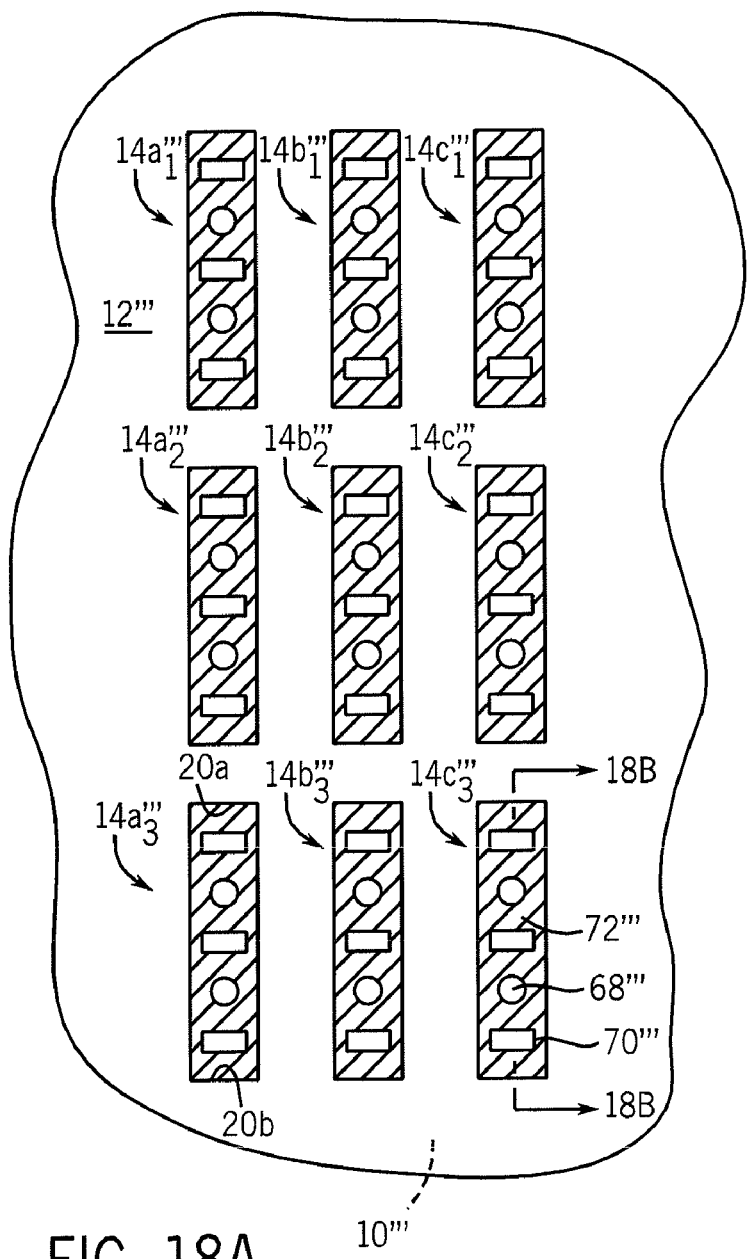
Figure 18B:
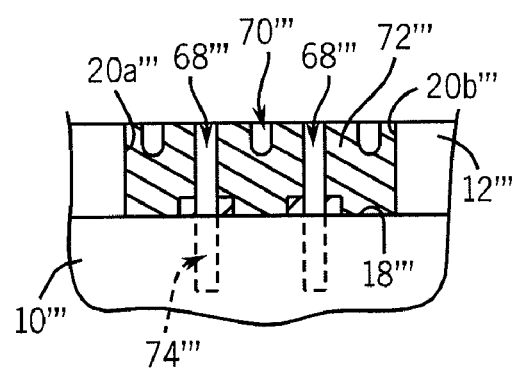

Referring now to FIGS. 18A and 18B, selective removal of one of the polymer domains (i.e., matrix or cylinders) can then be performed to produce a template for use in patterning the substrate 10'''. For example, selective removal of the cylindrical domains 62''', 64''' (e.g., of PMMA) will produce 2-D rectangular arrays of openings 68''', 70''' contained within a polymer matrix 72''' (e.g., of PS). The resulting film can be then used in patterning substrate 10'''. The configuration of the openings will vary according to the orientation of the cylindrical domains within the trenches. Only openings 68''' will extend to the trench floor 18''', thus the structure forms an etch mask which can selectively transfer the structural pattern of the perpendicular-oriented cylindrical domains 62''' to the underlying substrate (shown as phantom openings 74''').

Embodiments of the invention provide ordering of domains over a large area, and control the location and orientation of ordered cylindrical domains in two dimensions. Such features can be prepared more inexpensively than by electron beam lithography or EUV photolithography. The feature sizes produced and accessible by this invention cannot be prepared by conventional photolithography.

Example 1

Trenches 250 nm deep with widths ranging from 75 nm to 600 nm having silicon oxide sidewalls and silicon oxycarbide floors were provided. On several of the wafers, oxide was deposited onto the sidewalls and the trench floors. Both types of trench floors were treated to be neutral wetting to PS and PMMA.

To get perpendicular cylinders, a random PS:PMMA copolymer solution (about 58% PS) containing a cross-linking agent was cast as a film of about 5-10 nm thick onto the features, and annealed at about 160° C. for 4 hours. Capillary forces pulled the PS-r-PMMA to the trench floor prior to complete cross-linking, leaving oxide sidewalls that were preferential-wetting to PMMA. The resulting trench structure had sidewalls that were preferential wetting with the random copolymer layer as a mat on the bottom of the trenches, which provided a neutral wetting surface.

A 0.425% solution of cylinder-forming PS-b-PMMA in toluene was then cast onto the treated substrates so as to form a film about 30-40 nm thick. The PS-b-PMMA material (46K/21K PS:PMMA; 67K MW) was formulated to form PMMA-phase cylinders (diameter~20 nm) at repeat periods (pitch) of about 35 nm in the middle of a PS matrix. However, the arrays in adjoining trenches were not aligned.

In about 75 nm wide trenches, two rows of cylinders were formed that were slightly offset from each other, forming a "zigzag" structure in a regular registered pattern with each side being equidistant from the sidewall of the trench.

Example 2

Ternary blends (10-40%) of homopolymers (20 K PS, 20 K PMMA) were prepared in 0.425% solutions of 46K/21K PS-b-PMMA in toluene. These solutions were cast onto the substrates described above at thicknesses of 30-40 nm. The addition of homopolymers swells the domain sizes of the two fractions, resulting in an increased inherent pitch value ($L_o$) of the polymer.

At 10-20% homopolymers, a two row zigzag pattern of cylinders was formed as seen by SEM. With 30% homopolymers content, the zigzag pattern began to break down and numerous errors and unusual morphologies were observed. When a ternary blend of 46/21 PS-b-PMMA block copolymer with 40% 20 PS and 20K PMMA homopolymers was cast and annealed onto the same substrate (i.e., 80 nm wide trenches, (P(S-r-BCB-r-MMA)) floor, oxide sidewalls), single rows of perpendicular cylinders with apparent diameter of about 35 nm formed in the 80 nm wide trenches. At 40% homopolymers, the mixture caused a pitch of about 50 nm, resulting in the formation of a one-dimensional (1-D) array (single row) of cylinders. This is an example of graphoepitaxy technique in which lithographically defined physical features are used to cause ordering of block copolymer films. The cylinder arrays in adjacent trenches were not aligned and were off-set along the y-axis.

The results show that the boundary condition of the preferential wetting sidewalls and neutral wetting floor within a trench of width equal to the inherent pitch value ($L_o$) of the self-assembling polymer film enforced the formation of a single row of cylinders. The results also demonstrate that, by increasing $L_o$ so that it is a closer match to the sidewalls, there is a shift from a two row structure to a one row structure.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method for fabricating nanoscale microstructures, comprising:
    forming a copolymer film comprising a self-assembling block copolymer within a plurality of trenches to a thickness of about $L_o$, each trench having a width of about $L_o$, a length of about $nL_o$, a pitch distance between adjacent trenches of at least about $2*L_o$, preferential wetting sidewalls and ends, and a neutral wetting floor, with ends of the trenches aligned; and
    causing the copolymer film to form a single array of perpendicularly oriented cylindrical domains of a first polymer block of the block copolymer in a matrix of a second polymer block of the block copolymer within each trench of the plurality, wherein the pitch distance between each cylindrical domain within a trench is about $L_o$, and the pitch distance between the cylindrical domains of adjacent trenches is about $2*L_o$.

2. The method of claim 1, wherein the block copolymer comprises a blend of the block copolymer with a homopolymer of the first polymer block, the second polymer block, or both.

3. The method of claim 1, wherein the block copolymer comprises polystyrene and polymethyl methacrylate.

4. The method of claim 1, wherein the block copolymer comprises an about 60:40 to about 80:20 ratio of the first polymer block to the second polymer block.

5. The method of claim 1, wherein the sidewalls and ends comprise an oxide.

6. The method of claim 1, further comprising applying a neutral wetting material to the floors of the plurality of trenches.

7. The method of claim 6, further comprising applying a preferential wetting material to the sidewalls and ends of the plurality of trenches.

8. The method of claim 1, wherein the neutral wetting floor comprises a layer of a random copolymer.

9. The method of claim 8, further comprising applying a layer of a neutral wetting random copolymer onto the floors of the plurality of trenches.

10. The method of claim 1, wherein the neutral wetting floor comprises hydrogen-terminated silicon.

11. The method of claim 1, further comprising, after causing the copolymer film to form the single array of perpendicularly oriented cylindrical domains of the first polymer block, selectively removing the first polymer block to provide a rectangular array of cylindrical openings extending through the matrix of the second polymer block of the copolymer film.

12. The method of claim 11, further comprising etching a substrate through the rectangular array of cylindrical openings in the copolymer film.

13. The method of claim 1, further comprising selectively removing the second polymer block to provide a rectangular array of cylinders masking portions of a substrate.

14. The method of claim 13, further comprising etching unmasked portions of the substrate.

15. A method for fabricating nanoscale microstructures, comprising:
    forming a block copolymer film comprising an about 60:40 to about 80:20 ratio of a first polymer block to a second polymer block within a plurality of trenches to a thickness of about $L_o$, each trench of the plurality having a width of about $L_o$, a length of about $nL_o$, a pitch distance between adjacent trenches at least about $2*L_o$, preferential wetting sidewalls and ends, and a neutral wetting floor, with ends of the trenches aligned; and annealing the block copolymer film to form a single array of perpendicularly oriented cylindrical domains of the second polymer block of the block copolymer in a matrix of the first polymer block of the block copolymer within each trench of the plurality, wherein each trench of the plurality contains a single row of n cylindrical domains at a pitch distance of about $L_o$ and substantially parallel to the sidewalls of the trenches of the plurality, with the cylindrical domains of adjacent trenches at a pitch distance of about $2*L_o$.

16. A method of forming nanoscale microstructures, comprising:

forming a block copolymer film having a thickness of about $L_o$ within a plurality of trenches within a material layer, wherein each trench of the plurality has a width of at least about $L_o$, a length of about $nL_o$, a pitch distance between adjacent trenches of at least about $2*L_o$, preferential wetting sidewalls and ends, and a neutral wetting floor, with ends of the trenches aligned, the block copolymer film comprising an about 60:40 to about 80:20 ratio of a first polymer block to a second polymer block, and capable of microphase separating upon annealing into cylindrical domains within a matrix; and causing a microphase separation in the block copolymer to produce a single array of perpendicularly-oriented cylindrical microstructures composed of the second polymer block in a matrix of the first polymer block within each trench, wherein the pitch distance between adjacent cylindrical microstructures within each trench is about $L_o$ and the pitch distance between cylindrical microstructures of adjacent trenches is about $2*L_o$.

17. A method for fabricating nanoscale microstructures, comprising:

forming a neutral wetting material layer on a substrate;

forming a material layer on the neutral wetting material layer;

forming a plurality of trenches in the material layer, each trench of the plurality having a width of about $L_o$, a length of about $nL_o$, a pitch distance between adjacent trenches of at least about $2*L_o$, preferential wetting sidewalls and ends, and a floor defined by the neutral wetting material layer, with ends of the trenches aligned;

forming a copolymer film comprising a self-assembling block copolymer within the plurality of trenches to a thickness of about $L_o$; and causing the copolymer film to form a single array of perpendicularly oriented cylindrical domains of a first polymer block of the block copolymer in a matrix of a second polymer block of the block copolymer within each trench, wherein the pitch distance between each cylindrical domain within a trench is about $L_o$, and the pitch distance between the cylindrical domains of adjacent trenches is about $2*L_o$.

18. A method for fabricating nanoscale microstructures, comprising:

forming a first film comprising a self-assembling block copolymer within a first plurality of trenches within a material layer to a thickness of about $L_o$, each trench of the first plurality having a width of about $L_o$, a length of about $nL_o$, a pitch distance between adjacent trenches of at least about $2*L_o$, preferential wetting sidewalls and ends, and a neutral wetting floor, with ends of the trenches aligned;

causing the first copolymer film to form a single array of perpendicularly oriented cylindrical domains of a first polymer block of the block copolymer in a matrix of a second polymer block of the block copolymer within each trench of said first plurality of trenches, wherein the pitch distance between each cylindrical domain within a trench is about $L_o$, and the pitch distance between the cylindrical domains of adjacent first trenches is about $2*L_o$;

cross-linking the annealed first block copolymer film within each of the first trenches;

forming a second plurality of trenches by removing the material layer such that each trench of the second plurality of trenches is situated between the annealed and cross-linked first copolymer films within the trenches of the first plurality, each of the trenches of the second plurality having a width of about $L_o$, a length of about $nL_o$, a pitch distance between adjacent trenches of the plurality first and second of at least about $L_o$, preferential wetting sidewalls and ends, and a neutral wetting floor, with the ends of the second plurality of trenches aligned with the ends of the first plurality of trenches;

forming a second film comprising a self-assembling block copolymer within the second plurality of trenches to a thickness of about $L_o$; and causing the second copolymer film to form a single array of perpendicularly oriented cylindrical domains of a first polymer block of the block copolymer in a matrix of a second polymer block of the block copolymer within each of the trenches of the second plurality, wherein the pitch distance between each cylindrical domain within a second trench and between the cylindrical domain of adjacent trenches is about $L_o$.

19. The method of claim 18, wherein the sidewalls of the second plurality of trenches comprise the material layer, the matrix of the annealed first copolymer film, or a combination of both.

20. The method of claim 18, wherein forming the second plurality of trenches comprises exposing the matrix of the annealed first copolymer film to define the sidewalls of the second plurality of trenches.

21. A method of forming nanoscale microstructures, comprising:

depositing a block copolymer within a first plurality of trenches within a material layer to form a first block copolymer film having a thickness of about $L_o$, wherein each trench has a width of at least about $L_o$, a length of about $nL_o$, a pitch distance between adjacent trenches of at least about $2*L_o$, preferential wetting sidewalls and ends, and a neutral wetting floor, with ends of the first plurality of trenches aligned, the block copolymer comprising an about 60:40 to about 80:20 ratio of a first polymer block to a second polymer block and capable of microphase separating upon annealing into cylindrical domains within a matrix;

causing a microphase separation in the first block copolymer film to produce a single array of perpendicularly-oriented cylindrical microstructures composed of the second polymer block in a matrix of the first polymer block within each of the first plurality of trenches, wherein adjacent cylindrical microstructures within each trench are separated by a pitch distance of about $L_o$, and cylindrical microstructures of adjacent first trenches are separated by a pitch distance of about $2*L_o$;

cross-linking the first block copolymer film within each trench of the first plurality of trenches;

forming a second plurality of trenches by removing the material layer between the cross-linked first copolymer film within the first plurality of trenches, each trench of the second plurality of trenches having a width of about $L_o$, a length of about $nL_o$, a pitch distance between adjacent trenches of the first and second plurality of trenches of at least about $L_o$, preferential wetting sidewalls and ends, and a neutral wetting floor, with the ends of the second plurality of trenches aligned with the ends of the first plurality of trenches;

depositing the block copolymer within the second plurality of trenches to form a second copolymer film having a thickness of about $L_o$; and causing a microphase separation in the block copolymer to produce a single array of perpendicularly-oriented cylindrical microstructures composed of the first polymer block in a matrix of the second polymer block within each trench of the second plurality of trenches, wherein adjacent cylindrical microstructures within each trench of the second plurality of trenches and cylindrical microstructures of adjacent trenches of the first plurality are separated by a pitch distance of about $L_o$.

22. A method for fabricating nanoscale microstructures, comprising:

forming a neutral wetting material layer on a substrate;

forming a material layer on the neutral wetting material layer, the material layer defining a first plurality of trenches, each trench of the first plurality having a width of about $L_o$, a length of about $nL_o$, a pitch distance between adjacent trenches of at least about $2*L_o$, preferential wetting sidewalls, and a floor defined by the neutral wetting material layer, with ends of the trenches aligned;

forming a first film comprising a self-assembling block copolymer within the trenches of the first plurality to a thickness of about $L_o$;

annealing the first copolymer film to form a single array of perpendicularly oriented cylindrical domains of a first polymer block of the block copolymer in a matrix of a second polymer block of the block copolymer within each trench of the first plurality, wherein the pitch distance between each cylindrical domain within a trench is about $L_o$, and the pitch distance between the cylindrical domains of adjacent trenches is about $2*L_o$;

cross-linking the first block copolymer film within each trench of the first plurality of trenches;

forming a second plurality of trenches by removing the material layer between the cross-linked first copolymer film within the first plurality of trenches, each trench of the second plurality of trenches having a width of about $L_o$, a length of about $nL_o$, a pitch distance between adjacent trenches of the first and second plurality of at least about $L_o$, preferential wetting sidewalls, and a neutral wetting floor, with the ends of the second plurality of trenches aligned with the ends of the first plurality of trenches;

forming a second copolymer film comprising a self-assembling block copolymer within the second plurality of trenches to a thickness of about $L_o$; and causing a microphase separation in the second copolymer film to produce a single array of perpendicularly-oriented cylindrical microstructures composed of a first polymer block in a matrix of a second polymer block within each trench of the second plurality of trenches, wherein adjacent cylindrical microstructures within each trench of the second plurality and cylindrical microstructures of adjacent trenches of the first plurality are separated by a pitch distance of about $L_o$.

23. The method of claim 1, wherein causing the copolymer film to form a single array of perpendicularly oriented cylindrical domains of a first polymer block of the block copolymer in a matrix of a second polymer block of the block copolymer within each trench of the plurality comprises annealing the copolymer film to form the single array of perpendicularly oriented cylindrical domains of the first polymer block in the matrix of the second polymer block.

24. The method of claim 1, wherein causing the copolymer film to form a single array of perpendicularly oriented cylindrical domains of a first polymer block of the block copolymer in a matrix of a second polymer block of the block copolymer within each trench of the plurality comprises causing a microphase separation in the block copolymer to form the single array of perpendicularly-oriented cylindrical domains of the first polymer block in the matrix of the second polymer block.

25. The method of claim 1, further comprising, prior to forming the copolymer film within the plurality of trenches:

forming a neutral wetting material layer on a substrate;

forming a material layer on the neutral wetting material layer; and forming a plurality of trenches in the material layer.

26. The method of claim 1, further comprising, after causing the copolymer film to form a single array of perpendicularly oriented cylindrical domains of the first polymer block in the matrix of the second polymer block:

cross-linking the copolymer film within each of the trenches of the plurality to form a first cross-linked copolymer film;

forming a second plurality of trenches by removing a material layer such that each trench of said second plurality of trenches is situated between the cross-linked copolymer films, each trench of the second plurality of trenches having a width of about $L_o$, a length of about $nL_o$, a pitch distance of at least about $L_o$ between adjacent trenches, preferential wetting sidewalls and ends, and a neutral wetting floor, with the ends of the trenches of the plurality aligned;

forming a second film comprising a self-assembling block copolymer within the second plurality of trenches to a thickness of about $L_o$; and causing the second film to form a single array of perpendicularly oriented cylindrical domains of a first polymer block of the block copolymer in a matrix of a second polymer block of the block copolymer within each trench of the second plurality of trenches, wherein the pitch distance between each cylindrical domain within a second trench of the second plurality of trenches and the pitch distance between the cylindrical domains of adjacent trenches is about $L_o$.

27. The method of claim 1, further comprising, prior to forming the copolymer film, forming a layer of a neutral wetting material on a preferential wetting substrate;

masking the layer of neutral wetting material to provide a series of masked and unmasked sections, each unmasked section having a width at or about $L_o$, and each masked section having a width at or about $nL_o$;

removing the unmasked sections of the layer of neutral wetting material to expose sections of the preferential wetting substrate;

removing the masked section to expose sections of the layer of neutral wetting material;

forming a material layer over the sections of the preferential wetting substrate and the layer of neutral wetting material;

forming the plurality of trenches in the material layer to expose the sections of the preferential wetting substrate and the layer of neutral wetting material such that the sections are in a perpendicular orientation to sidewalls of the trenches, each trench having a width of about $L_0$ and a length of about $m*(n+1)*L_o$, where m is the number of sections of the preferential wetting substrate and n is the number of perpendicularly oriented cylinders, and m and n are independently 1-50.

28. The method of claim 27, wherein the block copolymer film forms a single array of cylindrical domains of the first polymer block of the block copolymer in a matrix of the second polymer block of the block copolymer within each trench, and the cylindrical domains on the sections of the layer of neutral wetting material are in a perpendicular orientation to the preferential wetting substrate, and the cylindrical domains on the sections of the layer of preferential wetting material are in a parallel orientation to the substrate.

* * * * *

UNITED STATES PATENT AND TRADEMARK OFFICE
CERTIFICATE OF CORRECTION

PATENT NO. : 8,394,483 B2  Page 1 of 1
APPLICATION NO. : 11/657273
DATED : March 12, 2013
INVENTOR(S) : Dan B. Millward It is certified that error appears in the above-identified patent and that said Letters Patent is hereby corrected as shown below:

In the Claims:

In column 14, line 9, in Claim 1, delete "$L_o$" and insert -- $L_o$, --, therefor.

In column 16, line 3, in Claim 18, delete "said" and insert -- the --, therefor.

In column 18, line 17, in Claim 25, delete "trenches:" and insert -- trenches; --, therefor.

In column 18, line 25, in Claim 26, delete "block:" and insert -- block; --, therefor.

In column 18, line 30, in Claim 26, delete "said" and insert -- the --, therefor.

In column 18, line 51, in Claim 27, delete "film," and insert -- film; --, therefor.

In column 18, line 61, in Claim 27, delete "section" and insert -- sections --, therefor.

In column 19, line 3, in Claim 27, delete "$L_0$" and insert -- $L_o$ --, therefor.

Signed and Sealed this
Twenty-eighth Day of May, 2013

Teresa Stanek Rea
*Acting Director of the United States Patent and Trademark Office*